US012666646B2

(12) United States Patent
Park et al.

(10) Patent No.: US 12,666,646 B2
(45) Date of Patent: Jun. 23, 2026

(54) SEMICONDUCTOR DEVICE

(71) Applicant: SAMSUNG ELECTRONICS CO., LTD., Suwon-si (KR)

(72) Inventors: Sang-Yong Park, Suwon-si (KR); Jin-Hong Park, Seoul (KR); Ju-Hee Lee, Ansan-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 406 days.

(21) Appl. No.: 18/199,516

(22) Filed: May 19, 2023

(65) Prior Publication Data

US 2024/0088239 A1 Mar. 14, 2024

(30) Foreign Application Priority Data

Sep. 13, 2022 (KR) ........................ 10-2022-0114692

(51) Int. Cl.
*H01L 29/417* (2006.01)
*H10D 30/43* (2025.01)
(Continued)

(52) U.S. Cl.
CPC ......... *H10D 30/6729* (2025.01); *H10D 30/43* (2025.01); *H10D 30/6735* (2025.01);
(Continued)

(58) Field of Classification Search
CPC ........... H10D 30/6729; H10D 30/6735; H10D 30/6757; H10D 62/121; H10D 64/258;
(Continued)

(56) References Cited

U.S. PATENT DOCUMENTS 5,850,093 A * 12/1998 Tarng ..................... H10D 30/63
257/E27.06
8,937,292 B2 1/2015 Bateman
(Continued)

FOREIGN PATENT DOCUMENTS

KR 10-2005-0112430 11/2005
KR 10-2006-0037561 5/2006
(Continued)

OTHER PUBLICATIONS

J. Ryckaert, et al., "Enabling Sub-5nm CMOS Technology Scaling Thinner and Taller!", 2019, IEEE, pp. IEDM19-685-688.
(Continued)

*Primary Examiner* — Jarrett J Stark
(74) *Attorney, Agent, or Firm* — MORGAN, LEWIS & BOCKIUS LLP

(57) ABSTRACT

A semiconductor device includes a substrate. A first channel pattern is disposed on the substrate. The first channel pattern includes a first side and a second side opposite to each other in a first direction. A first gate electrode is disposed on the first side of the first channel pattern. A first source/drain electrode is disposed on the first side of the first channel pattern. A second source/drain electrode is disposed on the second side of the first channel pattern. The first gate electrode overlaps the second source/drain electrode in the first direction.

18 Claims, 26 Drawing Sheets

(51) Int. Cl.

| | | |
|---|---|---|
| *H10D 30/67* | (2025.01) | |
| *H10D 62/10* | (2025.01) | |
| *H10D 64/23* | (2025.01) | |

(52) U.S. Cl.

CPC ....... *H10D 30/6757* (2025.01); *H10D 62/121* (2025.01); *H10D 64/258* (2025.01)

(58) Field of Classification Search

CPC .... H10D 30/701; H10D 84/85; H10D 30/611; H10D 30/6713; H10D 30/6734

See application file for complete search history.

(56) References Cited

U.S. PATENT DOCUMENTS

| | | | |
|---|---|---|---|
| 9,570,609 B2 | 2/2017 | Obradovic | |
| 10,043,796 B2 | 8/2018 | Machkaoutsan et al. | |
| 10,516,047 B2* | 12/2019 | Sio | B82Y 10/00 |
| 10,629,538 B2 | 4/2020 | Zhang | |
| 10,727,835 B2* | 7/2020 | Lupino | H01L 23/5226 |
| 11,227,864 B1* | 1/2022 | Saeedi Vahdat ... | H10D 30/6713 |
| 2007/0001219 A1* | 1/2007 | Radosavljevic ..... | H10D 30/024 |
| | | | 257/327 |
| 2008/0258226 A1* | 10/2008 | Ishiguro ............... | H10D 84/038 |
| | | | 257/E27.059 |
| 2009/0321830 A1* | 12/2009 | Maly .................. | H10D 30/0411 |
| | | | 257/E29.286 |
| 2017/0186882 A1 | 6/2017 | Koldiaev et al. | |
| 2021/0118799 A1 | 4/2021 | Liebmann | |
| 2021/0375883 A1* | 12/2021 | Hsu ........................ | H10B 10/12 |
| 2022/0037466 A1* | 2/2022 | Lee ...................... | H10D 62/235 |
| 2022/0208766 A1* | 6/2022 | Kim ...................... | H10B 12/30 |

FOREIGN PATENT DOCUMENTS

| | | |
|---|---|---|
| KR | 10-2012-0037459 | 4/2012 |
| KR | 10-2012-0089543 | 8/2012 |
| KR | 10-2018-0123422 | 11/2018 |

OTHER PUBLICATIONS

Xiong Xiong et al., "Demonstration of Vertically-stacked CVD Monolayer Channels: MoS2 Nanosheets GAA-FET with Ion>700 µA/µm and MoS2/WSe2 CFET", 2021, pp. IEDM21-162-165.

\* cited by examiner

B-B

D-D

D-D

F-F

H-H

SEMICONDUCTOR DEVICE

CROSS-REFERENCE TO RELATED APPLICATION

This application claims priority under 35 U.S.C. § 119 to Korean Patent Application No. 10-2022-0114692, filed on Sep. 13, 2022 in the Korean Intellectual Property Office, the disclosure of which is incorporated by reference in its entirety herein.

TECHNICAL FIELD

The present disclosure relates to a semiconductor device, and more particularly, a semiconductor device stacked three-dimensionally.

DISCUSSION OF RELATED ART

A multi gate transistor in which a multi-channel active pattern (e.g., a silicon body) having a fin or nanowire shape is formed on a substrate and a gate is formed on a surface of the multi-channel active pattern has been proposed as a scaling down technology for increasing the density of a semiconductor device.

Since such a multi gate transistor utilizes a three-dimensional channel, scaling is easily performed. Further, even if a gate length of the multi gate transistor is not increased, the current control capability may be increased. Furthermore, a SCE (short channel effect) in which a potential of a channel region is influenced by a drain voltage may be effectively suppressed.

SUMMARY

Aspects of embodiments of the present disclosure provide a semiconductor device capable of increasing element performance and reducing an element area.

However, aspects of embodiments of the present disclosure are not restricted to the one set forth herein. The above and other aspects of embodiments of the present disclosure will become more apparent to one of ordinary skill in the art to which the present disclosure pertains by referencing the detailed description of embodiments of the present disclosure given below.

According to an embodiment of the present disclosure, a semiconductor device includes a substrate. A first channel pattern is disposed on the substrate. The first channel pattern includes a first side and a second side opposite to each other in a first direction. A first gate electrode is disposed on the first side of the first channel pattern. A first source/drain electrode is disposed on the first side of the first channel pattern. A second source/drain electrode is disposed on the second side of the first channel pattern. The first gate electrode overlaps the second source/drain electrode in the first direction.

According to an embodiment of the present disclosure, a semiconductor device includes a substrate. A first source/drain electrode is disposed on the substrate. The first source/drain electrode extends in a first direction. A second source/drain electrode is disposed on the substrate. The second source/drain electrode extends in the first direction. A first channel pattern is spaced apart from the substrate in the first direction. The first channel pattern is disposed between the first source/drain electrode and the second source/drain electrode. A second channel pattern is spaced apart from the first channel pattern in the first direction. The second channel pattern is disposed between the first source/drain electrode and the second source/drain electrode. A first gate electrode is disposed on the first channel pattern and the second channel pattern and extends in the first direction. The first gate electrode is spaced apart from the first source/drain electrode in a second direction crossing the first direction. The first gate electrode overlaps the first source/drain electrode in the second direction. The second source/drain electrode is spaced apart from the first gate electrode in a third direction that crosses the first and second directions. The second source/drain electrode overlaps the first gate electrode in the third direction.

According to an embodiment of the present disclosure, a semiconductor device includes a substrate. A first channel pattern is spaced apart from the substrate. The first channel pattern includes an upper side and a lower side opposite to each other in a first direction. The lower side of the first channel pattern faces the substrate. A first gate electrode is disposed on the upper side of the first channel pattern. A first source/drain electrode is disposed on the upper side of the first channel pattern, and is spaced apart from the first gate electrode in a second direction perpendicular to the first direction. A second source/drain electrode is disposed on the lower side of the first channel pattern and overlaps the first gate electrode in the first direction. A second channel pattern is disposed on the first gate electrode and the first source/drain electrode. The second channel pattern includes an upper side and a lower side spaced apart from each other in the first direction. The lower side of the second channel pattern faces the upper side of the first channel pattern. A third source/drain electrode is disposed on the upper side of the second channel pattern and overlaps the first gate electrode in the first direction.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

In the present specification, although terms such as first and second are used to describe various elements or components, these elements or components are not necessarily limited by these terms. These terms are only used to distinguish a single element or component from other elements or components. Therefore, a first element or component referred to below may be a second element or component within the technical idea of the present disclosure.

A semiconductor device according to some embodiments will be described below with reference to FIGS. 1 to 3.

Figure 1:
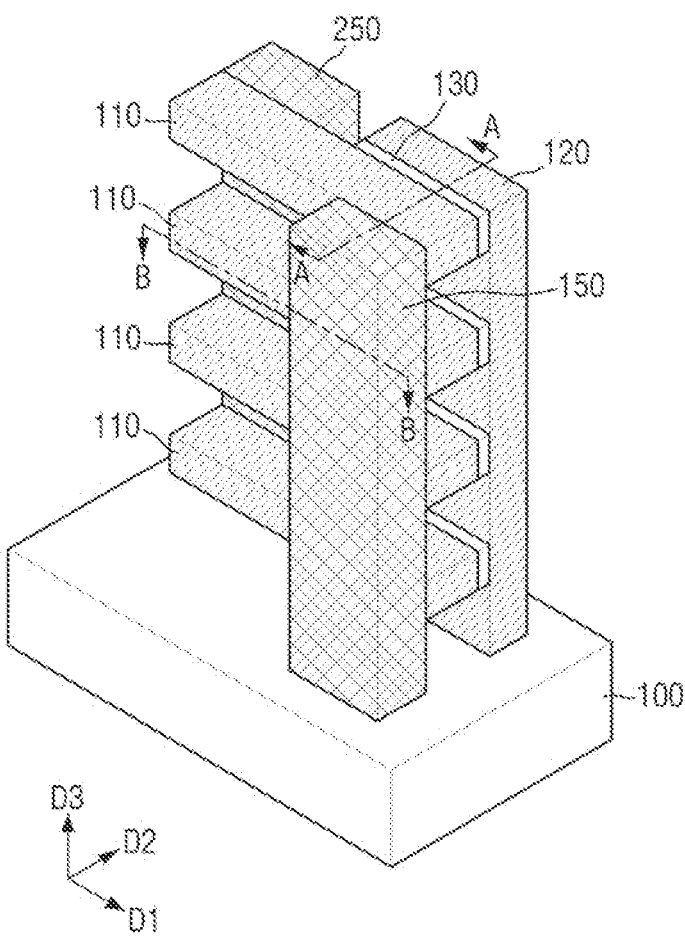
FIG. 1 is a perspective view for explaining a semiconductor device according to an embodiment.

FIG. 1 is a perspective view for explaining a semiconductor device according to some embodiments. FIG. 2 is a cross-sectional view taken along line A-A of FIG. 1. FIG. 3 is a plan view taken along B-B of FIG. 1 and viewed from above.

For convenience of explanation, a semiconductor of FIG. 1 is shown except for an outer mold insulating film 190 and an inner mold insulating film 195.

Figure 2:
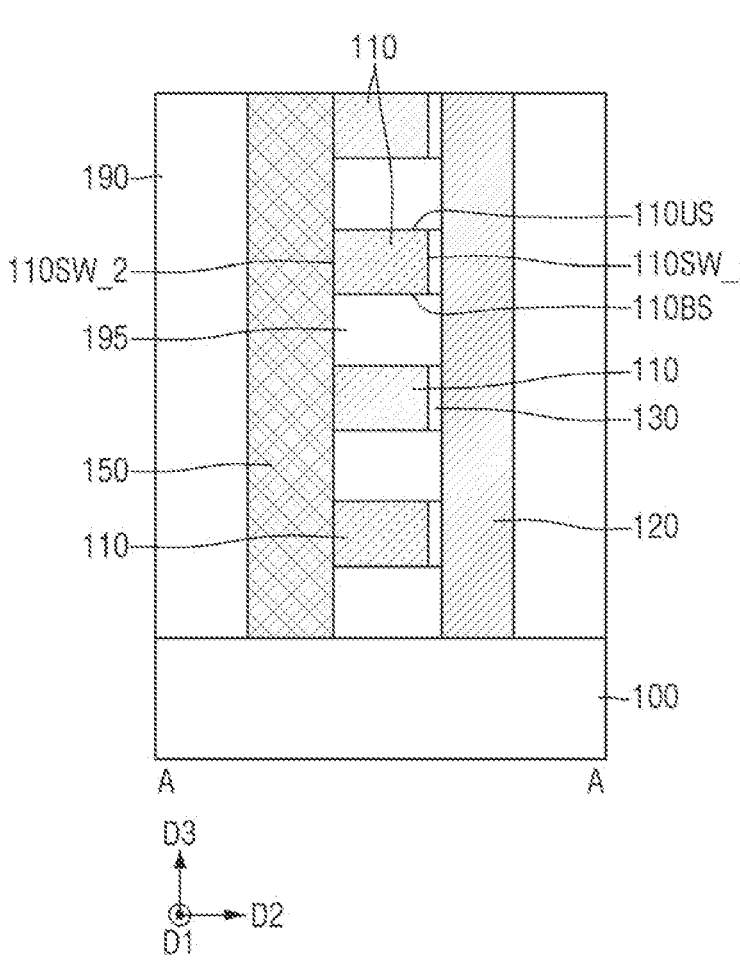
FIG. 2 is a cross-sectional view taken along line A-A of FIG. 1 according to an embodiment.
Figure 3:
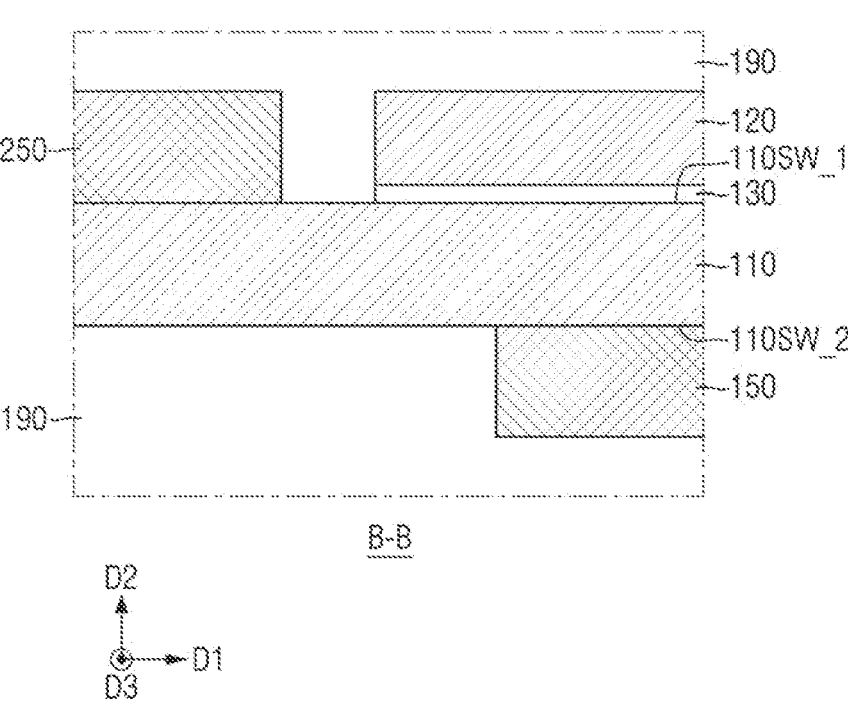
FIG. 3 is a plan view taken along B-B of FIG. 1 and viewed from above according to an embodiment.

Referring to FIGS. 1 to 3, a semiconductor device according to some embodiments may include a plurality of first channel patterns 110, a first gate electrode 120, a first source/drain electrode 150, and a second source/drain electrode 250.

In an embodiment, the substrate 100 may be bulk silicon or silicon-on-insulator (SOI). In some embodiments, the substrate 100 may be a silicon substrate, or may include, but is not necessarily limited to, other materials, for example, silicon germanium, SGOI (silicon germanium on insulator), indium antimonide, lead tellurium compounds, indium arsenic, indium phosphide, gallium arsenide or gallium antimonide. In an embodiment, the substrate 100 may be, but is not necessarily limited to, a rigid substrate such as a ceramic substrate, a quartz substrate or a display glass substrate, or a flexible plastic substrate such as polyimide, polyethylene terephthalate (PEI), polyethylene naphthalate (PEN), poly methyl methacrylate (PMMA), polycarbonate (PC), polyether sulfone (PES), and polyester.

A plurality of first channel patterns 110 may be disposed on the substrate 100. The first channel pattern 110 may be spaced apart from the substrate 100 in a third direction D3 that is perpendicular to an upper surface of the substrate 100 and is a thickness direction of the substrate 100. Each first channel pattern 110 may extend in a first direction D1.

The plurality of first channel patterns 110 may be disposed sequentially in the thud direction D3. Each first channel pattern 110 may be spaced apart in the third direction D3.

The first channel pattern 110 may include an upper side 110US and a lower side 110BS. The upper side 110US of the first channel pattern is a surface that is opposite to the lower side 110BS of the first channel pattern in the third direction D3. The lower side HOBS of the first channel pattern may face the substrate 100.

The first channel pattern 110 may include a first side surface 110SW_1 and a second side surface 110SW_2. The first side surface 110SW_1 of the first channel pattern is a surface (e.g., a lateral side surface) that is opposite to the second side surface 110SW_2 (e.g., the opposite lateral side surface) of the first channel pattern in the second direction D2. The first side surface 110SW_1 of the first channel pattern and the second side surface 110SW_2 of the first channel pattern each extend in the first direction D1. The third direction D3 may be a direction that intersects the first direction D1 and the second direction D2. The first direction D1 may be a direction that intersects the second direction D2.

Although four first channel patterns 110 are shown as being disposed on the substrate 100 in an embodiment of FIGS. 1-2, embodiments of the present disclosure are not necessarily limited thereto and the number of the first channel patterns 110 may vary. For example, in an embodiment the number of first channel patterns 110 disposed on the substrate 100 may be three or less or may be five or more.

In some embodiments, when the plurality of first channel patterns 110 are disposed on the substrate 100, the first channel pattern 110 closest to the substrate 100 may directly contact with the substrate 100, unlike embodiments shown in FIGS. 1-2.

In an embodiment, the first channel pattern 110 includes a semiconductor material. As an example, the first channel pattern 110 may include silicon or germanium which is an elemental semiconductor material. Also, the first channel pattern 110 may include a compound, semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge) and tin (Sn), or a compound obtained by doping these elements with a group IV element.

The group III-V compound semiconductor may be, for example, one of a binary compound, a ternary compound or a quaternary compound formed by combining at least one of aluminum (Al), gallium (Ga) and indium (In) as a group III element with one of phosphorus (p), arsenic (As) and antimony (Sb) as a group V element.

As another example, the first channel pattern 110 may include a two-dimensional material (2D material). For example, in an embodiment the first channel pattern 110 may include a 2D allotrope or a 2D compound. The two-dimensional compound may include, for example, a TMD (Transition Metal Dichalcogenide) material. The first channel pattern 110 may include, for example, but is not necessarily limited to, at least one of graphene, molybdenum disulfide (MoS$_2$), molybdenum diselenide (MoSe$_2$), molybdenum ditelluride (MoTe$_2$), tungsten diselenide (WSe$_2$), tungsten disulfide (WS$_2$), and tungsten ditelluride (WTe$_2$).

As yet another example, the first channel pattern 110 may include metal oxide. In an embodiment, the first channel pattern 110 may include amorphous metal oxide, polycrystalline metal oxide, or a combination of amorphous metal oxide and polycrystalline metal oxide. The first channel pattern 110 may include, for example, but is not necessarily limited to, indium oxide, tin oxide, zinc oxide, In—Zn-based oxide (MO), Sn—Zn-based oxide, Ba—Sn-based oxide, Al—Zn-based oxide, Zn—Mg-based oxide, Sn—Mg-based oxide, In—Mg-based oxide, In—Ga-based oxide (IGO), In—Ga—Zn-based oxide (IGZO), In—Al—Zn-based oxide, In—Sn—Zn-based oxide (ITZO), In—W—Zn-based oxide (IWZO), Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxides.

The first gate electrode 120 is disposed on (e.g., disposed directly thereon in the third direction D3) the substrate 100. The first gate electrode 120 may extend, for example, in the third direction D3.

The first gate electrode 120 may be disposed on the first channel pattern 110. For example, the first gate electrode 120 may be disposed on the first side surface 110SW_1 of the first channel pattern.

The first channel pattern 110 may include a first lower channel pattern 110 and a first upper channel pattern 110 adjacent to each other in the third direction D3. The first upper channel pattern 110 and the first lower channel pattern 110 may be any two first channel patterns 110 adjacent to each other in the third direction D3. The first lower channel pattern 110 is spaced apart from the substrate 100 in the third direction D3. The first upper channel pattern 110 is spaced apart from the first lower channel pattern 110 in the third direction. The first gate electrode 120 is disposed on the first lower channel pattern 110 and the first upper channel pattern 110. For example, the first gate electrode 120 on the first lower channel pattern 110 is directly connected to the first gate electrode 120 on the first upper channel pattern 110.

In an embodiment, the first gate electrode 120 may include, for example, at least one of metal, metal alloy, conductive metal nitride, conductive metal carbide, conductive metal carbonitride, metal silicide, doped semiconductor material, conductive metal oxide and conductive metal oxynitride.

The first gate insulating film 130 is disposed between the first gate electrode 120 and the first channel pattern 110 (e.g., in the second direction D2). The first gate insulating film 130 may be disposed on (e.g., disposed directly thereon in the second direction D2) the first side surface 110SW_1 of the first channel pattern.

When the first channel pattern 110 includes the first lower channel pattern 110 and the first upper channel pattern 110 adjacent to each other in the third direction D3, the first gate insulating film 130 on the first lower channel pattern 110 may be spaced apart from the first gate insulating film 130 on the first upper channel pattern 110 in the third direction D3. However, embodiments of the present disclosure are not necessarily limited thereto. For example, in an embodiment the first gate insulating film 130 on the first lower channel pattern 110 may be connected to the first gate insulating film 130 on the first upper channel pattern 110.

In an embodiment, the first gate insulating film 130 may include silicon oxide, silicon-germanium oxide, germanium oxide, silicon oxynitride, silicon nitride or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Although the first gate insulating film 130 is shown as a single film, this is only for convenience of explanation, and it is not necessarily limited thereto. For example, in an embodiment the first gate insulating film 130 may include a plurality of films. The first gate insulating film 130 may include an interfacial layer disposed between the first channel pattern 110 and the first gate electrode 120, and a high dielectric constant insulating film.

The semiconductor device according to some embodiments may include an NC (Negative Capacitance) FET that uses a negative capacitor. For example, the first gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By increasing the overall capacitance value, a transistor including the ferroelectric material film may have a sub-threshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. For example, in an embodiment, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

In an embodiment in which the ferroelectric material film includes hafnium oxide, the dopant included in the ferroelectric material film may include, for example, at least one of gadolinium (Gd), silicon (Si), zirconium (Zr), aluminum (Al), and yttrium (Y).

In an embodiment in which the dopant is aluminum (Al), the ferroelectric material film may include aluminum in a range of about 3 to about 8 at % (atomic %). Here, a ratio of the dopant may be a ratio of aluminum to the sum of hafnium and aluminum.

In an embodiment in which the dopant is silicon (Si), the ferroelectric material film may include silicon in a range of about 2 to about 10 at %. In an embodiment in which the dopant is yttrium (Y), the ferroelectric material film may include yttrium in a range of about 2 to about 10 at %. In an embodiment in which the dopant is gadolinium (Gd), the ferroelectric material film may include gadolinium in a range of about 1 to about 7 at %. In an embodiment in which the dopant is zirconium (Zr), the ferroelectric material film may include zirconium in a range of about 50 to about 80 at %.

The paraelectric material film may have the paraelectric properties. The paraelectric material film may include at least one of, for example, a silicon oxide and a metal oxide having a high dielectric constant. The metal oxide included in the paraelectric material film may include, for example, but is not necessarily limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric, material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric, material film may be, for example, but is not necessarily limited to, about 0.5 to about 10 nm. Since a critical thickness that exhibits the ferroelectric properties may vary for each ferroelectric material, the thickness of the ferroelectric material film may vary depending on the ferroelectric material.

As an example, the first gate insulating film 130 may include a ferroelectric material film. As another example, the first gate insulating film 130 may include a plurality of ferroelectric material films spaced apart from each other. The first gate insulating film 130 may have a stacked film structure in which a plurality of ferroelectric material films and a plurality of paraelectric material films are alternately stacked.

The first source/drain electrode 150 is disposed on (e.g., disposed directly thereon in the third direction D3) the substrate 100. The first source/drain electrodes 150 may extend, for example, in the third direction D3.

The first source/drain electrode 150 may be disposed on the first channel pattern 110. For example, the first source/drain electrodes 150 may be disposed on (e.g., disposed directly thereon in the second direction D2) the second side surface 110SW_2 of the first channel pattern. The first source/drain electrode 150 may directly contact the first channel pattern 110.

The second source/drain electrode 250 is disposed on (e.g., disposed directly thereon in the third direction D3) the substrate 100. The second source/drain electrode 250 may extend, for example, in the third direction D3.

The second source/drain electrode 250 may be disposed on the first channel pattern 110. For example, the second source/drain electrode 250 may be disposed on (e.g., disposed directly thereon in the second direction D2) the first side surface 110SW_1 of the first channel pattern. The second source/drain electrode 250 may directly contact the first channel pattern 110.

In an embodiment, the first source/drain electrode 150 and the second source/drain electrode 250 may each include, for example, at least one of metal, metal alloy, conductive metal nitride, conductive metal carbide, conductive metal carbonitride, metal silicide, doped semiconductor material, conductive metal oxide and conductive metal oxynitride.

The first channel pattern 110 is disposed between the first source/drain electrode 150 and the second source/drain electrode 250 (e.g., in the second direction D2). In an embodiment in which the first channel pattern 110 includes the first lower channel pattern 110 and the first upper channel pattern 110 adjacent to each other in the third direction D3, the first lower channel pattern 110 and the first upper channel pattern 110 channel pattern 110 are disposed between the first source/drain electrode 150 and the second source/drain electrode 250 (e.g., in the second direction D2).

The first source/drain electrode 150 may be spaced apart from the first gate electrode 120 in the second direction D2. The first channel pattern 110 is disposed between the first source/drain electrode 150 and the first gate electrode 120. The first source/drain electrode 150 may overlap the first gate electrode 120 in the second direction D2. In this Specification, the term "overlap" includes partially overlapping or fully overlapping unless otherwise specified.

The second source/drain electrodes 250 may be spaced apart from the first gate electrode 120 in the first direction D1. The second source/drain electrode 250 may overlap the first gate electrode 120 in the first direction D1. The second source/drain electrode 250 may not overlap the first gate electrode 120 in the second direction D2. In an embodiment, the second source/drain electrode 250 may also not overlap the first source/drain electrode 150 in the second direction D2. There are no first channel patterns 110 disposed between the second source/drain electrode 250 and the first gate electrode 120 (e.g., in the first direction D1).

In an embodiment, the first source/drain electrode 150 may be the source electrode among the source electrode and the drain electrode. A portion of the first channel pattern 110 that is in direct contact with the first source/drain electrode 150 may be the source region of a transistor. For example, in an embodiment the first source/drain electrode 150 may be connected to a power line. The first source/drain electrode 150 may be connected to, for example, but is not necessarily limited to, a ground voltage line or a positive voltage line.

In an embodiment, the second source/drain electrode 250 may be the drain electrode among the source electrode and the drain electrode. A portion of the first channel pattern 110 that is in direct contact with the second source/drain electrode 250 may be the drain region of the transistor.

The first source/drain electrode 150 and the second source/drain electrode 250 are not disposed on the same side surface of the first channel pattern 110. The first source/drain electrode 150 and the second source/drain electrode 250 are disposed on the side surfaces of the first channel pattern 110 opposite to each other (e.g., in the second direction D2). For example, the first source/drain electrode 150 and the second source/drain electrode 250 are disposed in diagonally opposite directions to each other with the first channel pattern 110 interposed therebetween. Since the area of the semiconductor device is decreased from a planar viewpoint, the degree of integration of the semiconductor device may be increased.

In a comparative embodiment in which the first source/drain electrode 150 and the second source/drain electrode 250 are disposed on the same side surface of the first channel pattern 110, the current may concentrate on an edge region of the first source/drain electrode 150 adjacent to the first gate electrode 120. For example, the area in which the first source/drain electrode 150 injects charges into the first channel pattern 110 is less than the area in which the first source/drain electrode 150 is in direct contact with the first channel pattern 110. Accordingly, the magnitude of the current flowing through the channel region of the transistor decreases.

In the semiconductor device according to an embodiment of the present disclosure, the first gate electrode 120 and the first source/drain electrode 150 face each other with the first channel pattern 110 interposed therebetween (e.g., in the second direction D2). Since the first gate electrode 120 faces the first source/drain electrode 150 which may be the source electrode, the first gate electrode 120 may change the electric field in the first channel pattern 110 that overlaps the first source/drain electrode 150. For example, the first gate electrode 120 may increase the area in which the first source/drain electrode 150 injects charges into the first channel pattern 110. Accordingly, the magnitude of the current flowing through the channel region of the transistor increases. Thus, performance and reliability of the semiconductor device may be increased.

The inner mold insulating film 195 (FIG. 2) may be disposed between the first channel patterns 110 adjacent to each other in the third direction D3. The inner mold insulating film 195 may be disposed between the substrate 100 and the first channel pattern 110 (e.g., in the third direction DR3).

In an embodiment, the inner mold insulating film 195 may include, for example, at least one of silicon nitride (SiN), silicon oxynitride (SiON), silicon oxide (SiO₂), silicon oxycarbonitride (SiOCN), silicon boronitride (SiBN), silicon oxyboronitride (SiOBN), silicon oxycarbide (SiOC), and combinations thereof.

The outer mold insulating film 190 is disposed on the substrate 100. The outer mold insulating film 190 may cover side walls of the first gate electrode 120, side walls of the first source/drain electrodes 150, and side walls of the second source/drain electrodes 250.

In an embodiment, the outer mold insulating film 190 may include, for example, at least one of silicon oxide, silicon nitride, silicon oxynitride, and a low dielectric constant material. The low dielectric constant material may include, for example, but is not necessarily limited to, at least one of Fluorinated TetraEthylOrthoSilicate (FTEOS). Hydrogen SilsesQuioxane (HSQ). Bis-benzoCycloButene (BCB), TetraMethylOrthoSilicate (TMOS), OctaMethyleyClo-TetraSiloxane (OMCTS), HexaMethylDiSiloxane (HMDS), TriMethylSilyl Borate (TMSB), DiAcetoxyDitertiaryButo-Siloxane (DADBS), TriMethylSilil Phosphate (TMSP), PolyTetraFluoroEthylene (PTFE), TOSZ (Toners SilaZen), FSG (Fluoride Silicate Glass), polyimide nanofoams such as polypropylene oxide, CDO (Carbon Doped silicon Oxide), OSG (Organo Silicate Glass), SiLK. Amorphous Fluorinated Carbon, silica aerogels, silica xerogels, mesoporous silica or combinations thereof.

Figure 4:
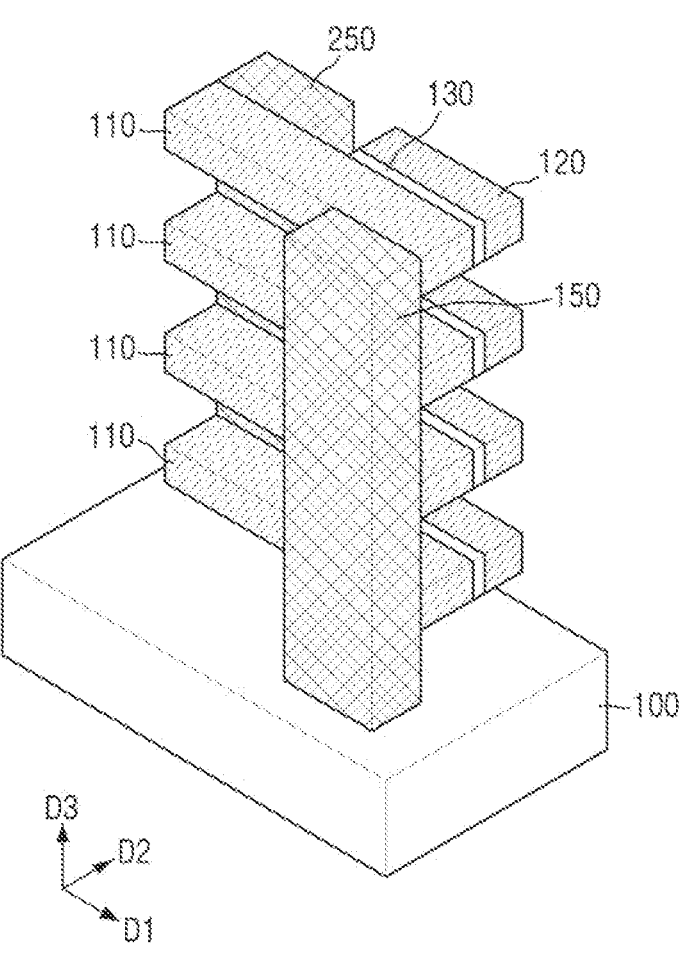
FIG. 4 is a perspective view of a semiconductor device according to an embodiment.

FIG. 4 is a diagram for explaining a semiconductor device according to some embodiments. For convenience of explanation, the explanation will focus on points that are different from those explained using FIGS. 1 to 3 and a repeated description of identical or similar elements may be omitted for economy of description.

Referring to FIG. 4, in the semiconductor device according to some embodiments, the first gate electrodes 120 disposed on each first channel pattern 110 may be separated from each other (e.g., in the third direction D3).

In an embodiment in which the first channel pattern 110 includes the first lower channel pattern 110 and the first upper channel pattern 110 adjacent to each other in the third direction D3, the first gate electrode 120 on the first lower channel pattern 110 may be spaced apart from the first gate electrode 120 on the first upper channel pattern 110 in the third direction D3.

Unlike an embodiment shown in FIG. 4, the first source/drain electrodes 150 disposed on each first channel pattern 110 may also be spaced apart in the third direction D3. Alternatively, the second source/drain electrodes 250 disposed on each first channel pattern 110 may be spaced apart from each other in the third direction 13.

FIGS. 5 to 8 are diagrams for explaining a semiconductor device according to some embodiments. For convenience of explanation, the explanation will focus on points that are different from those explained using FIGS. 1 to 3 and a repeated description of identical or similar elements may be omitted for economy of description.

Figure 5:
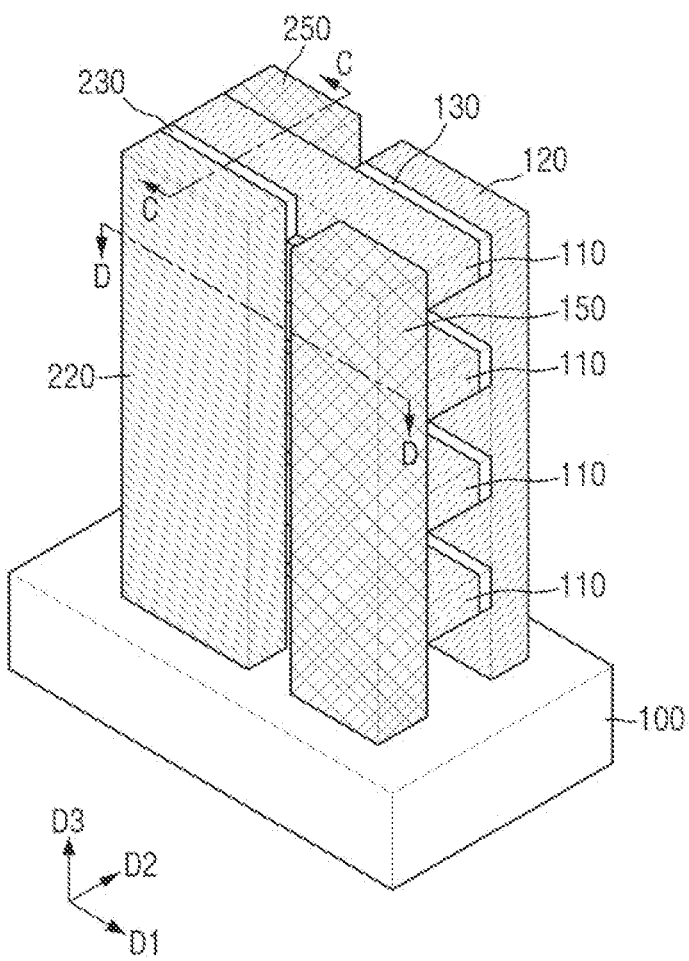
FIG. 5 is a perspective view of a semiconductor device according to an embodiment.
Figure 6:
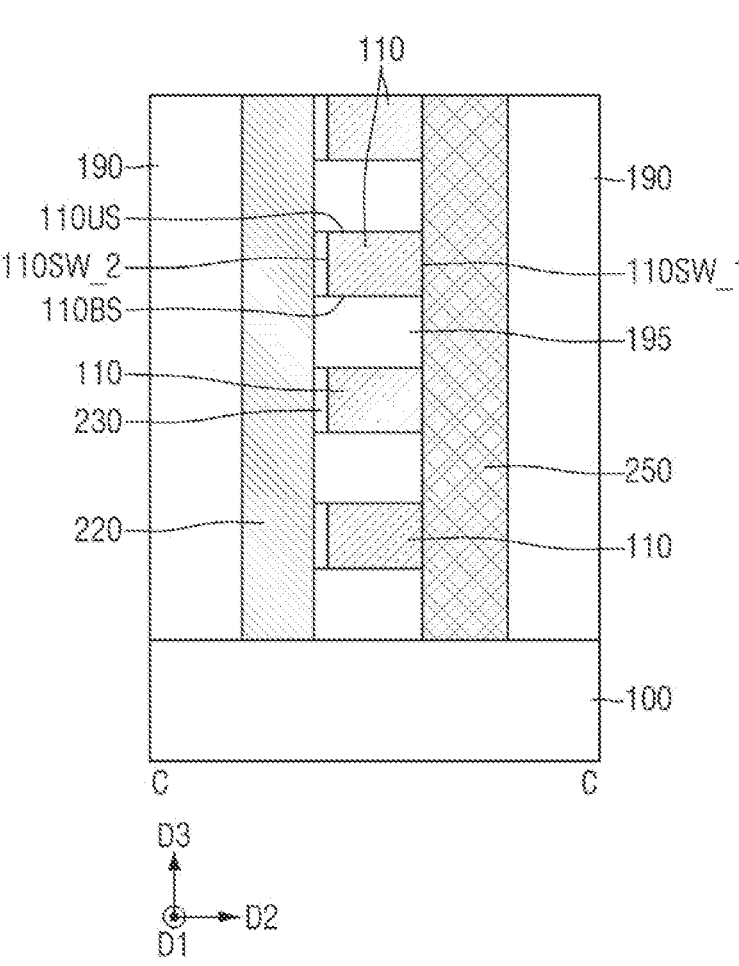
FIG. 6 is a cross-sectional view taken along C-C of FIG. 5 according to an embodiment.
Figure 7:
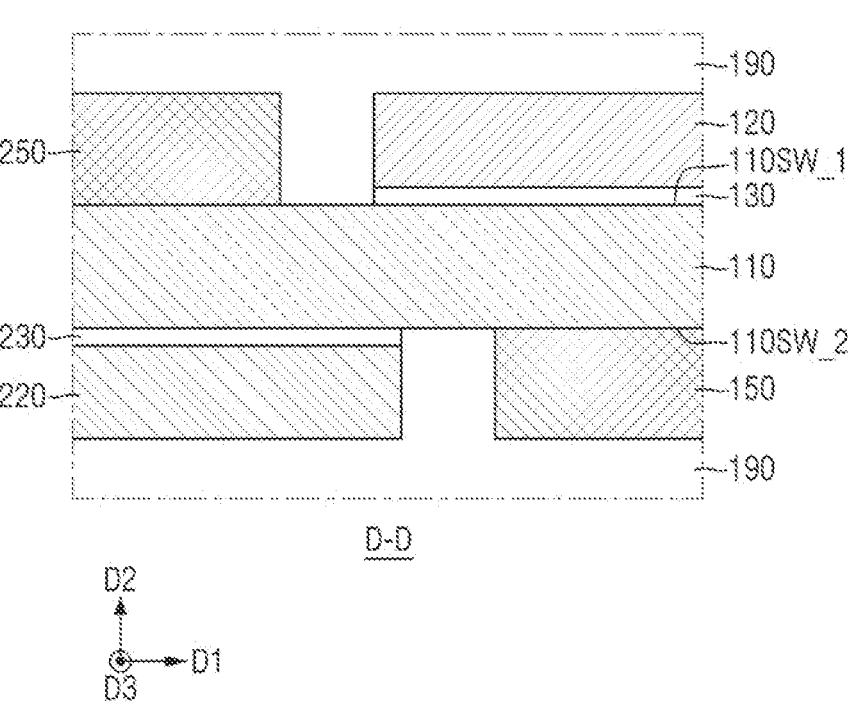
FIGS. 7 and 8 are plan views taken along line D-D of FIG. 5 and viewed from above according to an embodiment.
Figure 8:
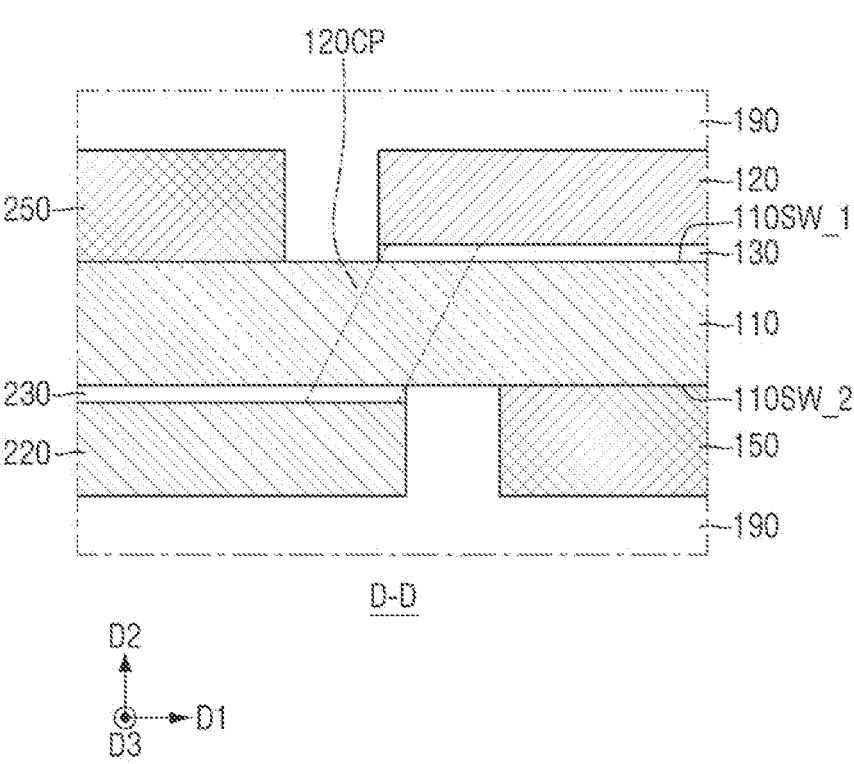

For reference, FIG. 5 is an perspective view for explaining a semiconductor device according to some embodiments. FIG. 6 is a cross-sectional view taken along C-C of FIG. 5. FIGS. 7 and 8 are plan views taken along line D-D of FIG. 5 and viewed from above.

Referring to FIGS. 5 to 7, the semiconductor device according to some embodiments may further include a second gate electrode 220.

The second gate electrode 220 is disposed on the substrate 100 (e.g., disposed directly thereon in the third direction D3). The second gate electrode 220 may extend, for example, in the third direction D3.

The second gate electrode 220 may be disposed on the first channel pattern 110. For example, the second gate electrode 220 may be disposed on (e.g., in the second direction D2) the second side surface 110SW_2 of the first channel pattern.

The first channel pattern 110 is disposed between the first gate electrode 120 and the second gate electrode 220. In an embodiment in which the first channel pattern 110 includes the first lower channel pattern 110 and the first upper channel pattern 110 adjacent in the third direction D3, the first lower channel pattern 110 and the first upper channel pattern 110 are disposed between the first gate electrode 120 and the second gate electrode 220.

The second gate electrode 220 is connected to (e.g., electrically connected to) the first gate electrode 120. In an embodiment, the voltage applied to the first gate electrode 120 is equal to the voltage applied to the second gate electrode 220, when the transistor operates.

As an example, in an embodiment a connection wiring disposed on the first gate electrode 120 and the second gate electrode 220 may connect the first gate electrode 120 and the second gate electrode 220.

As another example as shown in FIGS. 5 and 8, the first gate electrode 120 and the second gate electrode 220 may be connected by a connection gate electrode 120CP. The connection gate electrode 120CP is disposed between the first channel patterns 110 adjacent in the third direction D3.

In an embodiment, the second gate electrode 220 may include, for example, at least one of metal, metal alloy, conductive metal nitride, conductive metal carbide, conductive metal carbonitride, metal silicide, doped semiconductor material, conductive metal oxide, and conductive metal oxynitride.

A second gate insulating film 230 is disposed between the second gate electrode 220 and the first channel pattern 110 (e.g., in the second direction D2). The second gate insulating film 230 is disposed on (e.g., disposed directly thereon in the second direction D2) the second side surface 110SW_2 of the first channel pattern. In an embodiment, the second gate insulating film 230 may include silicon oxide, silicon oxide-germanium oxide, germanium oxide, silicon oxynitride, silicon nitride, or a high dielectric constant material having a higher dielectric constant than silicon oxide.

The first source/drain electrode 150 may be spaced apart from the second gate electrode 220 in the first direction D1. The first source/drain electrode 150 may overlap the second gate electrode 220 in the first direction D1. The first source/drain electrode 150 may not overlap the second gate electrode 220 in the second direction D2. There are no first channel patterns 110 disposed between the first source/drain electrode 150 and the second gate electrode 220 (e.g., in the first direction D1).

The second source/drain electrode 250 may be spaced apart from the second gate electrode 220 in the second direction D2. The first channel pattern 110 is disposed between the second source/drain electrode 250 and the second gate electrode 220 (e.g., in the second direction D2). The second source/drain electrode 250 may overlap the second gate electrode 220 in the second direction D2.

The second gate electrode 220 faces the second source/drain electrode 250 which is the drain electrode, thereby the leakage current of the semiconductor device may be reduced. Accordingly, the performance and reliability of the semiconductor device may be increased.

Figure 9:
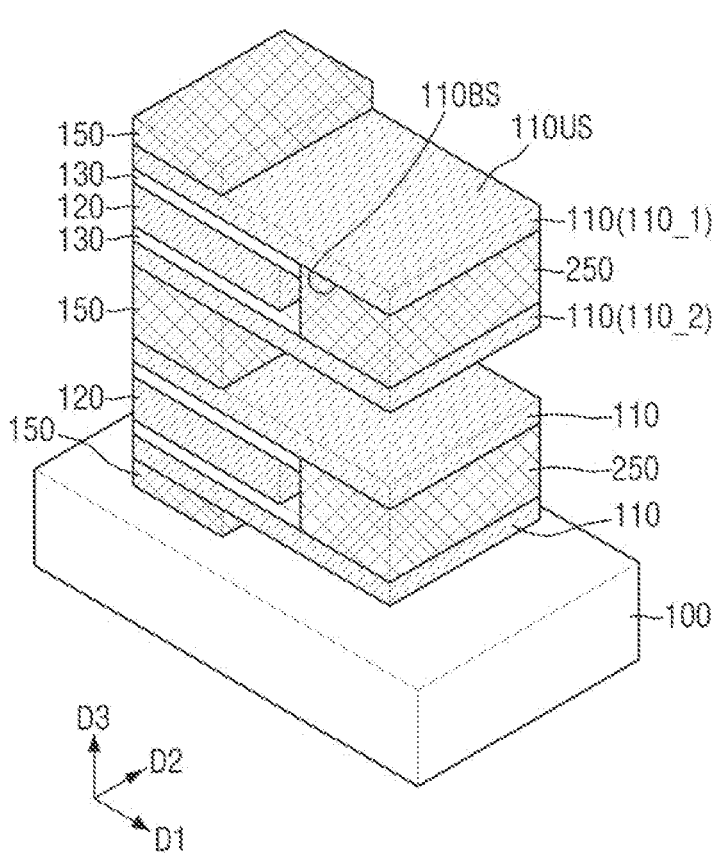
FIG. 9 is a perspective view of a semiconductor device according to an embodiment.

FIG. 9 is a diagram for explaining a semiconductor device according to some embodiments. For convenience of explanation, the explanation will focus on points that are different from those explained using FIGS. 1 to 3 and a repeated description of identical or similar elements may be omitted for economy of description.

Referring to FIG. 9, in the semiconductor device according to some embodiments, the first gate electrode 120 and the second source/drain electrode 250 may be disposed between the first channel patterns 110 adjacent in the third direction D3. The first gate electrode 120 and the second source/drain electrode 250 may be disposed between the upper side 110US of the first channel pattern and the lower side 110BS of the adjacent first channel pattern that face each other in the third direction D3.

The first source/drain electrodes 150 may be disposed between the first channel patterns 110 adjacent in the third direction D3. The first source/drain electrode 150 may be disposed between the upper side 110US of the first channel pattern and the lower side 110BS of the adjacent first channel pattern that face each other the third direction D3.

The first channel pattern 110 may include a first lower channel pattern 1102 and a first upper channel pattern 110_1 adjacent to each other in the third direction D3. The upper side 110US of the first lower channel pattern 110_2 faces the lower side 110BS of the first upper channel pattern 110_1.

The first gate electrode 120 and the second source/drain electrode 250 may be disposed on the upper side 110US of the first lower channel pattern 110_2. The first gate electrode 120 and the second source/drain electrodes 250 may each extend in the second direction D2.

The first source/drain electrode 150 may be disposed on the lower side 110BS of the first lower channel pattern 110_2. The first source/drain electrode 150 may be disposed on the upper side 110US of the first upper channel pattern 110_1. The first source/drain electrodes 150 may extend in the second direction D2.

The first source/drain electrode 150 may be spaced apart from the first gate electrode 120 in the third direction D3. In an embodiment, the first gate electrode 120 may overlap the first source/drain electrode 150 on the upper side 110US of the first upper channel pattern 110_1 in the third direction D3. The first gate electrode 120 may overlap the first source/drain electrode 150 on the lower side 110BS of the first lower channel pattern 110_2 in the third direction D3.

The first lower channel pattern 110_2 is disposed between the first source/drain electrode 150 and the first gate electrode 120 (e.g., in the third direction D3). The first upper channel pattern 110_1 is disposed between the first source/drain electrode 150 and the first gate electrode 120 (e.g., in the third direction D3).

The second source/drain electrode 250 may be spaced apart from the first gate electrode 120 in the first direction D1. The second source/drain electrode 250 may overlap the first gate electrode 120 in the first direction D1. The second source/drain electrode 250 may not overlap the first gate electrode 120 in the third direction D3. There are no first channel patterns 110 disposed between the second source/drain electrode 250 and the first gate electrode 120 (e.g., in the first direction D1).

The first upper channel pattern 110_1 may be disposed on the first gate electrode 120 and the second source/drain electrode 250 (e.g., in the third direction D3). The first gate electrode 120 and the second source/drain electrode 250 may be disposed between the upper side 110US of the first lower channel pattern 110_2 and the lower side 110BS of the first upper channel pattern 110_1 (e.g., in the third direction D3).

The first gate insulating film 130 is disposed between the first lower channel pattern 110_2 and the first gate electrode 120 (e.g., in the third direction D3), and the first upper channel pattern 110_1 and the first gate electrode 120 (e.g., in the third direction D3).

Figure 10:
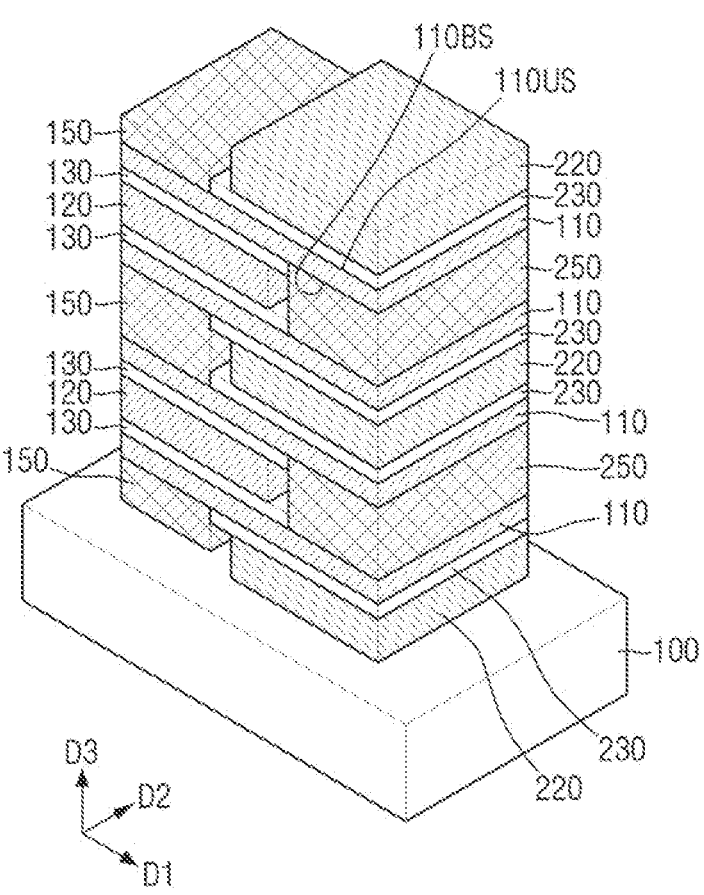
FIG. 10 is a perspective view of a semiconductor device according to an embodiment.

FIG. 10 is a diagram for explaining a semiconductor device according to some embodiments. For convenience of explanation, the explanation will focus on points different from those explained using FIG. 9 and a repeated description of identical or similar elements may be omitted for economy of description.

Referring to FIG. 10, the semiconductor device according to some embodiments may further include a second gate electrode 220 disposed between the first channel patterns 110 adjacent to each other in the third direction D3.

The second gate electrode 220 may be spaced apart from the first source/drain electrode 150 in the first direction D1 The second gate electrode 220 may overlap the first source/drain electrode 150 in the first direction D1.

The second gate electrode 220 may be spaced apart from the second source/drain electrode 250 in the third direction D3. The second gate electrode 220 may overlap the second source/drain electrode 250 in the third direction D3.

The second gate electrode 220 and the first source/drain electrode 150 may be disposed between the first channel patterns 110 adjacent to each other in the third direction D3. The second gate electrode 220 and the first source/drain electrode 150 may be disposed between the upper side 110US of the first channel pattern and the lower side 110BS of the adjacent first channel pattern that face each other in the third direction D3. The second gate electrode 220 is connected to the first gate electrode 120.

Figure 11:
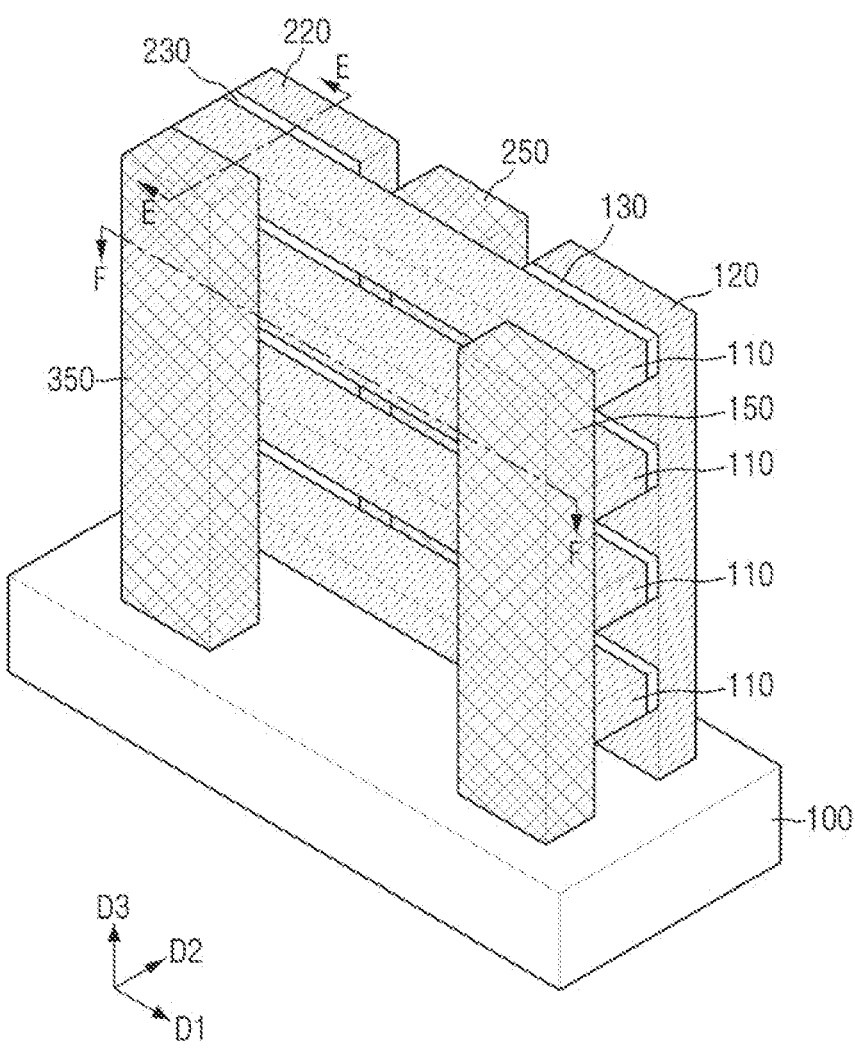
FIG. 11 is a perspective view of a semiconductor device according to an embodiment.
Figure 12:
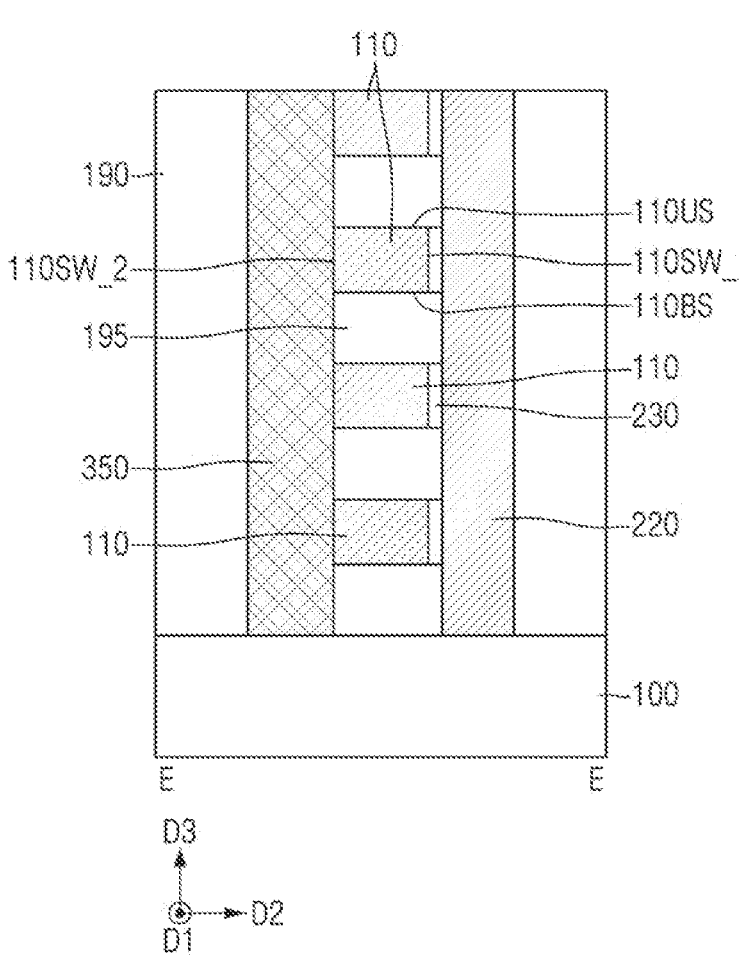
FIG. 12 is a cross-sectional view taken along E-E of FIG. 11 according to an embodiment.
Figure 13:
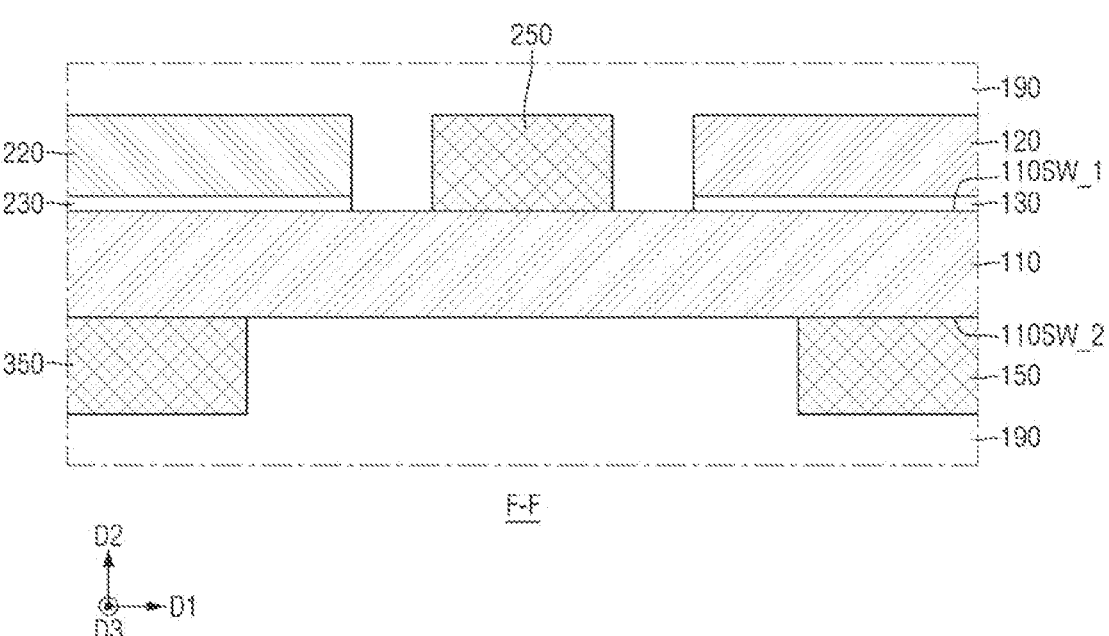
FIG. 13 is a plan view taken along line F-F of FIG. 11 and viewed from above according to an embodiment.

FIGS. 11 to 13 are diagrams for explaining a semiconductor device according to some embodiments. For convenience of explanation, the explanation will focus on points that are different from those explained using FIGS. 1 to 3 and a repeated description of identical or similar elements may be omitted for economy of description.

For reference, FIG. 11 is a perspective view for explaining a semiconductor device according to some embodiments.

FIG. 12 is a cross-sectional view taken along E-E of FIG. 11. FIG. 13 is a plan view taken along line F-F of FIG. 11 and viewed from above.

Referring to FIGS. 11 to 13, the semiconductor device according to some embodiments may further include a second gate electrode 220 and a third source/drain electrode 350.

The second gate electrode 220 is disposed on the substrate 100 (e.g., disposed directly thereon in the third direction D3). The second gate electrode 220 may extend, for example, in the third direction D3.

The second gate electrode 220 may be disposed on the first channel pattern 110. For example, the second gate electrode 220 may be disposed on the first side surface 110SW_1 of the first channel pattern (e.g., in the second direction D2).

The second gate electrode 220 may be spaced apart from the second source/drain electrode 250 in the first direction D1. The second gate electrode 220 may overlap the second source/drain electrode 250 in the first direction D1.

The first gate electrode 120, the second gate electrode 220 and the second source/drain electrode 250 may be disposed on the first side surface 110SW_1 of the first channel pattern. The second source/drain electrode 250 is disposed between the first gate electrode 120 and the second gate electrode 220 (e.g., in the first direction D1). The second gate electrode 220 may be connected to the first gate electrode 120.

In an embodiment, the second gate electrode 220 may include, for example, at least one of metal, metal alloy, conductive metal nitride, conductive metal carbide, conductive metal carbonitride, metal silicide, doped semiconductor material, conductive metal oxide and conductive metal oxynitride.

The second gate insulating film 230 is disposed between the second gate electrode 220 and the first channel pattern 110 (e.g., in the second direction D2).

The third source/drain electrode 350 is disposed on the substrate 100 (e.g., disposed directly thereon in the third direction D3). The third source/drain electrode 350 may extend, for example, in the third direction D3.

The third source/drain electrode 350 may be disposed on the first channel pattern 110. For example, the third source/drain electrode 350 may be disposed on the second side surface 110SW_2 of the first channel pattern (e.g., in the second direction D2). The third source/drain electrode 350 may directly contact the first channel pattern 110.

The third source/drain electrode 350 may be spaced apart from the first source/drain electrode 150 in the first direction D1. The third source/drain electrode 350 may overlap the first source/drain electrode 150 in the first direction D1.

In an embodiment, the third source/drain electrode 350 may include, for example, at least one of metal, metal alloy, conductive metal nitride, conductive metal carbide, conductive metal carbonitride, metal silicide, doped semiconductor material, conductive metal oxide and conductive metal oxynitride.

The third source/drain electrode 350 may be spaced apart from the second gate electrode 220 in the second direction D2. The first channel pattern 110 is disposed between the third source/drain electrode 350 and the second gate electrode 220 (e.g., in the second direction D2). The third source/drain electrode 350 may overlap the second gate electrode 220 in the second direction D2.

In an embodiment, the third source/drain electrode 350 may be the source electrode among the source electrode and the drain electrode. For example, the third source/drain electrode 350 may be connected to a power line.

For example, the first gate electrode 120 may be a gate electrode of PMOS, and the second gate electrode 220 may be a gate electrode of NMOS. As another example, the first gate electrode 120 may be a gate electrode of NMOS, and the second gate electrode 220 may be a gate electrode of PMOS. Hereinafter, it will be described that the first gate electrode 120 is the gate electrode of PMOS, and the second gate electrode 220 is the gate electrode of NMOS for convenience of explanation.

In a gate voltage interval in which a hole may be injected into the channel region, the hole may move in the first channel pattern 110. In such a gate voltage interval, the first gate electrode 120 may be used as a gate of PMOS, and the second gate electrode 220 may be used as a gate of NMOS.

Figure 14:
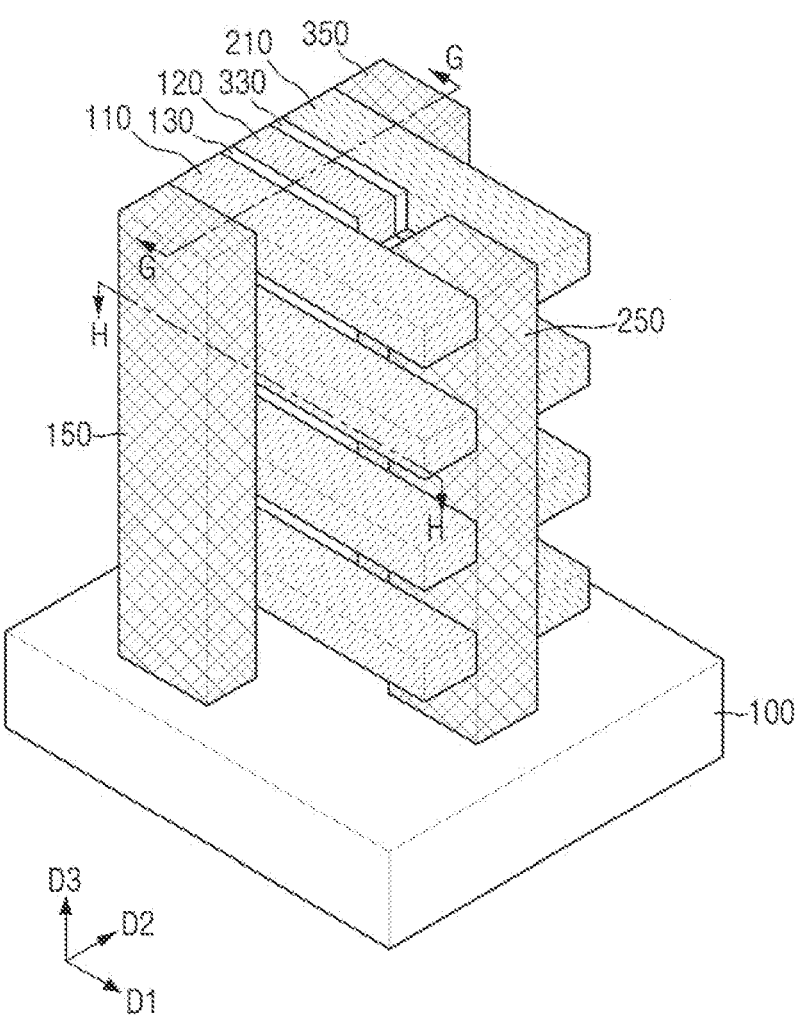
FIG. 14 is a perspective view of a semiconductor device according to an embodiment.
Figure 15:
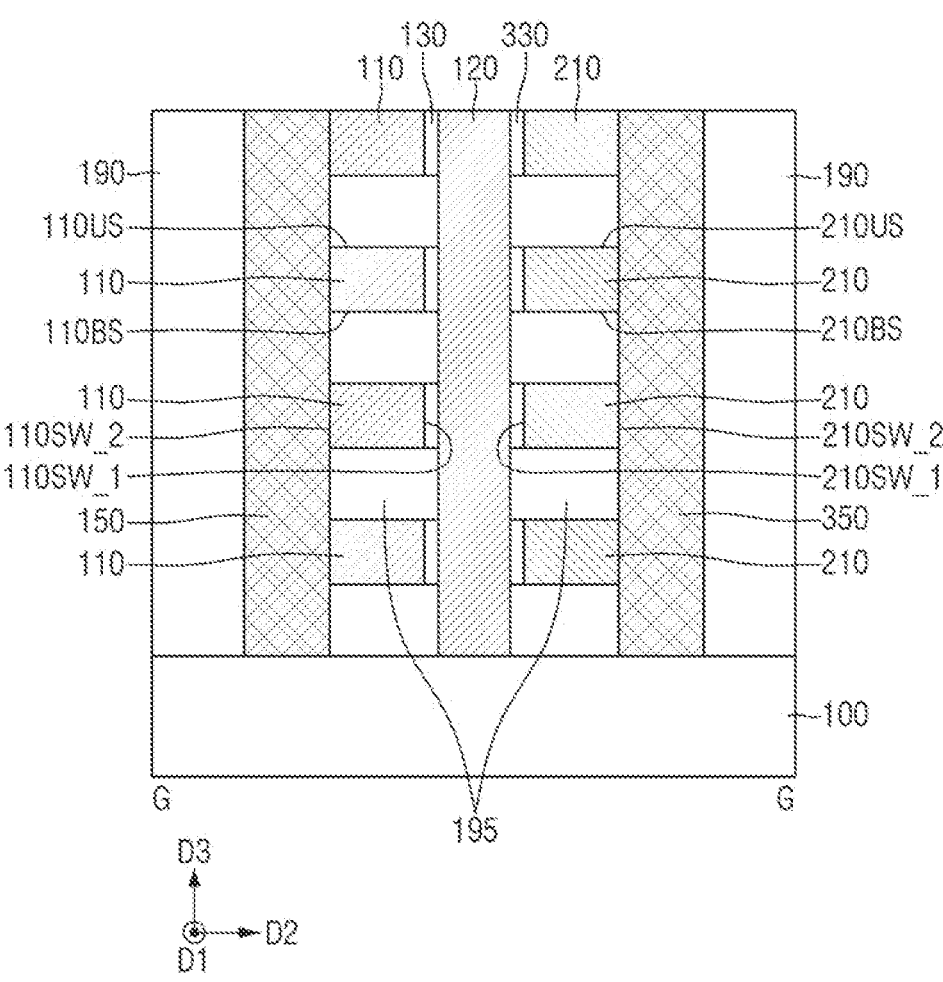
FIG. 15 is a cross-sectional view taken along G-G of FIG. 14 according to an embodiment.
Figure 16:
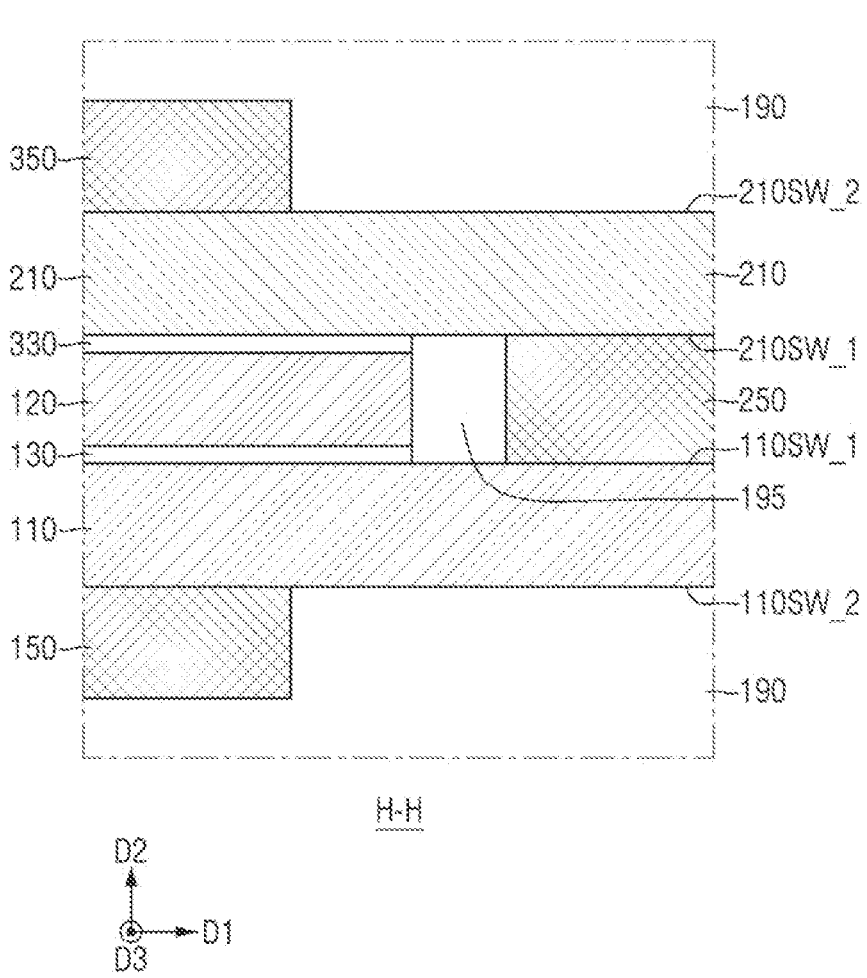
FIG. 16 is a plan view taken along line H-H of FIG. 14 and viewed from above according to an embodiment.

FIGS. 14 to 16 are diagrams for explaining a semiconductor device according to some embodiments. For convenience of explanation, the explanation will focus on points that are different from those explained using FIGS. 1 to 3 and a repeated description of identical or similar elements may be omitted for economy of description.

For reference, FIG. 14 is a perspective view for explaining a semiconductor device according to some embodiments. FIG. 15 is a cross-sectional view taken along G-G of FIG. 14. FIG. 16 is a plan view taken along line H-H of FIG. 14 and viewed from above.

Referring to FIGS. 14 to 16, the semiconductor device according to some embodiments may further include a second channel pattern 210 and a third source/drain electrode 350.

A plurality of second channel patterns 210 may be disposed on the substrate 100. The second channel patterns 210 may be spaced apart from the substrate 100 in the third direction D3. Each second channel pattern 210 may extend in the first direction D1.

In an embodiment, the second channel pattern 210 may be spaced apart from the first channel pattern 110 in the second direction D2. The second channel pattern 210 may be disposed at a height corresponding to that of the first channel pattern 110. For example, the first and second channel patterns 110, 210 may be coplanar (e.g., in the third direction D3).

The plurality of second channel patterns 210 may be disposed sequentially in the third direction D3. Each second channel pattern 210 may be spaced apart in the third direction D3.

The second channel pattern 210 may include an upper side 210US and a lower side 210BS. The upper side 210US of the second channel pattern is a surface that is opposite to the lower side 210BS of the second channel pattern in the third direction D3. The lower side 210BS of the second channel pattern may face the substrate 100.

The second channel pattern 210 may include a first side surface 210SW_1 and a second side surface 210SW_2. The first side surface 210SW_1 of the second channel pattern is a surface that is opposite to the second side surface 210SW_2 of the second channel pattern in the second direction D2. The first side surface 210SW_1 of the second channel pattern faces the first side surface 110SW_1 of the first channel pattern.

The second channel pattern 210 includes a semiconductor material. As an example, the second channel pattern 210 may include silicon or germanium which is an elemental semiconductor material. As another example, the second channel pattern 210 may include one of a compound semiconductor material, a two-dimensional material (2D material), and a metal oxide.

The first gate electrode 120 is disposed between the first channel pattern 110 and the second channel pattern 210 (e.g., in the second direction D2). The first gate electrode 120 is disposed on the first side surface 210SW_1 of the second channel pattern (e.g., in the second direction D2). The first gate electrode 120 is disposed between the first side surface 110SW_1 of the first channel pattern and the first side surface 210SW_1 of the second channel pattern (e.g., in the second direction D2).

The third gate insulating film 330 is disposed between the first gate electrode 120 and the second channel pattern 210 (e.g., in the second direction D2). The third gate insulating film 330 is disposed on the first side surface 210SW_1 of the second channel pattern (e.g., disposed directly thereon in the second direction D2). In an embodiment, the third gate insulating film 330 may include silicon oxide, silicon-germanium oxide, germanium oxide, silicon oxynitride, silicon nitride, or a high dielectric constant material having a higher dielectric constant than silicon oxide.

The second source/drain electrode 250 is disposed between the first channel pattern 110 and the second channel pattern 210 (e.g., in the second direction D2). The second source/drain electrode 250 is disposed between the first side surface 110SW_1 of the first channel pattern and the first side surface 210SW_1 of the second channel pattern. The second source/drain electrode 250 may directly contact the second channel pattern 210.

The third source/drain electrode 350 is disposed on the substrate 100. The third source/drain electrodes 350 may extend, for example, in the third direction D3.

The third source/drain electrode 350 may be disposed on the second channel pattern 210 (e.g., disposed directly thereon in the second direction D2). For example, the third source/drain electrode 350 may be disposed on the second side surface 210SW_2 of the second channel pattern. The third source/drain electrode 350 may directly contact the second channel pattern 210.

The third source/drain electrode 350 may be spaced apart from the first gate electrode 120 in the second direction D2. The second channel pattern 210 is disposed between the third source/drain electrode 350 and the first gate electrode 120 (e.g., in the second direction D2). The third source/drain electrode 350 may overlap the first gate electrode 120 in the second direction D2. The third source/drain electrode 350 may overlap the first source/drain electrode 150 in the second direction D2. The third source/drain electrode 350 may not overlap the second source/drain electrode 250 in the second direction D2.

In an embodiment, the first source/drain electrode 150 and the third source/drain electrode 350 may be the source electrode among the source electrode and the drain electrode. The second source/drain electrode 250 may be the drain electrode among the source electrode and the drain electrode.

As an example, the first channel pattern 110 may be used as a channel region of PMOS, and the second channel pattern 210 may be used as a channel region of NMOS. As another example, the first gate electrode 120 may be a gate electrode of NMOS, and the second gate electrode 220 may be a gate electrode of PMOS.

Figure 17:
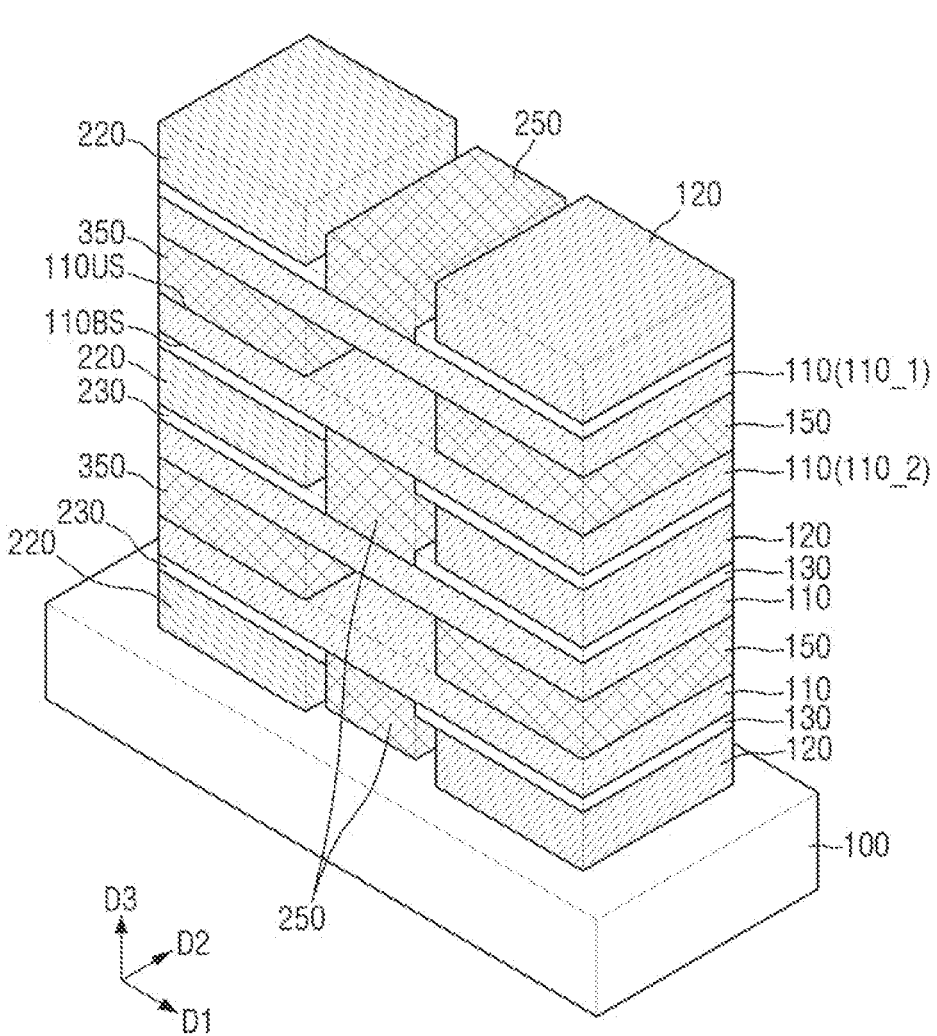
FIG. 17 is a perspective view of a semiconductor device according to an embodiment.

FIG. 17 is a diagram for explaining a semiconductor device according to some embodiments. For convenience of explanation, the explanation will focus on points different from those explained using FIG. 9 and a repeated description of identical or similar elements may be omitted for economy of description.

Referring to FIG. 17, the semiconductor device according to some embodiments may further include a second gate electrode 220 and a third source/drain electrode 350.

The second gate electrode 220 may be disposed between the upper side 110US of the first channel pattern and the lower side 110BS of the first channel pattern that face each other in the third direction D3. The first gate electrode 120, the second gate electrode 220 and the second source/drain electrode 250 may be disposed between the first channel patterns 110 adjacent to each other in the third direction D3. The second gate electrode 220 may be spaced apart from the second source/drain electrode 250 in the first direction D1. The second source/drain electrode 250 may be disposed between the first gate electrode 120 and the second gate electrode 220 (e.g., in the first direction D1).

The third source/drain electrode 350 may be disposed between the upper side 110US of the first channel pattern and the lower side 110BS of the first channel pattern that face each other in the third direction D3. The first source/drain electrode 150 and the third source/drain electrode 350 may be disposed between the first channel patterns 110 adjacent to each other in the third direction D3. The third source/drain electrode 350 may overlap the second gate electrode 220 in the third direction D3.

One of the first gate electrode 120 and the second gate electrode 220 may be a gate electrode of PMOS, and the other thereof may be a gate electrode of NMOS.

Figure 18:
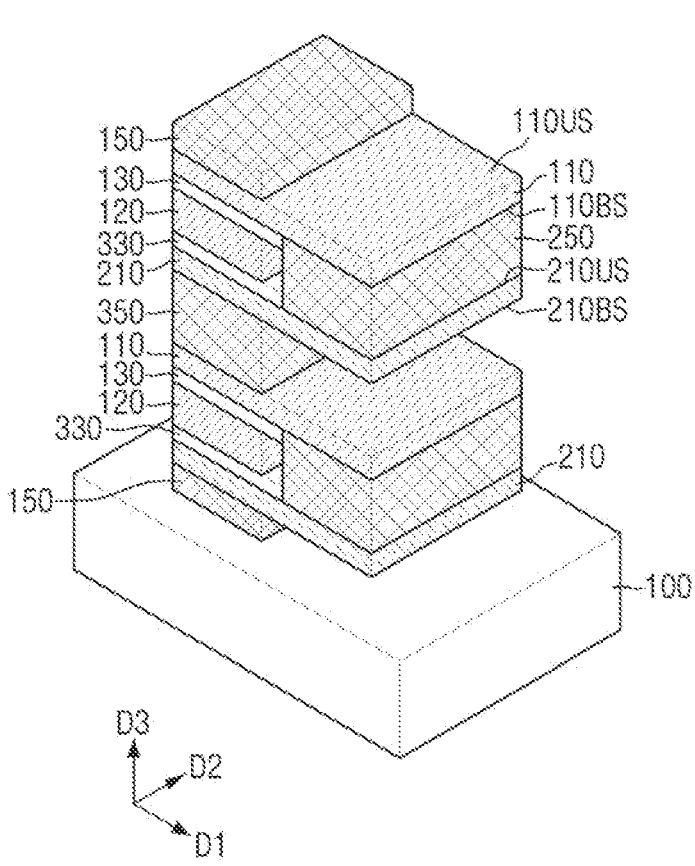
FIG. 18 is a perspective view of a semiconductor device according to an embodiment.

FIG. 18 is a diagram for explaining a semiconductor device according to some embodiments. For convenience of explanation, the explanation will focus on points that are different from those explained using FIGS. 14 to 16 and a repeated description of identical or similar elements may be omitted for economy of description.

Referring to FIG. 18, in a semiconductor device according to some embodiments, the first channel patterns 110 and the second channel patterns 210 may be alternately disposed on the substrate 100 (e.g., in the third direction D3).

The first gate electrode 120 and the second source/drain electrode 250 may be disposed between the lower side 110BS of the first channel pattern and the upper side 210US of the second channel pattern (e.g., in the third direction D3). The first source/drain electrode 150 may be disposed on (e.g., disposed directly thereon in the third direction D3) the upper side 110US of the first channel pattern. The third source/drain electrode 350 may be disposed on (e.g., disposed directly thereon in the third direction D3) the lower side 210BS of the second channel pattern.

The first source/drain electrode 150 and the third source/drain electrode 350 may overlap the first gate electrode 120 in the third direction D3. The first source/drain electrode 150 and the third source/drain electrode 350 may not overlap the second source/drain electrode 250 in the third direction D3.

FIGS. 19 to 26 are intermediate step diagrams for explaining a method for fabricating the semiconductor device according to some embodiments. For reference, FIGS. 19 to 26 may be the method for fabricating the semiconductor device described using FIGS. 5 to 8.

Figure 19:
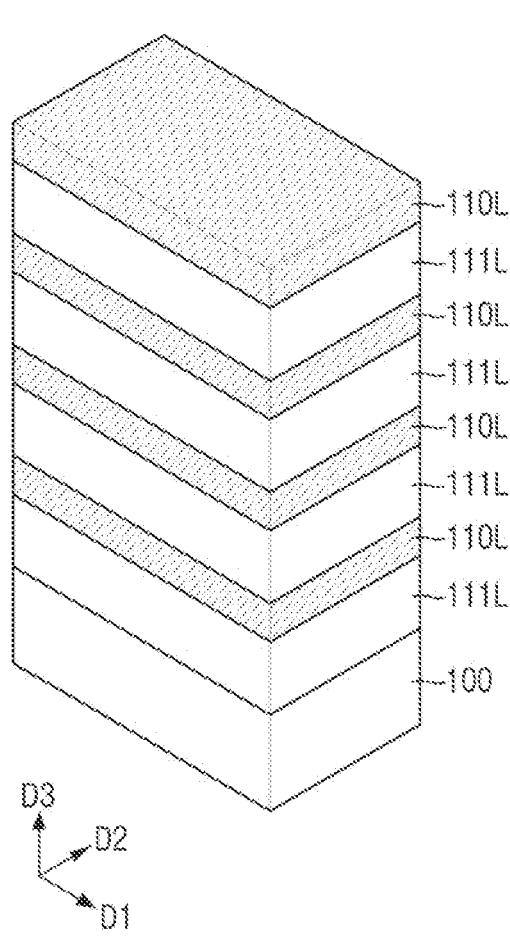
FIGS. 19 to 26 are perspective views of intermediate steps of a method for fabricating the semiconductor device according to some embodiments.

Referring to FIG. 19, a sacrificial mold film 111L and a channel film 110L may be alternately stacked on the substrate 100 (e.g., in the third direction D3).

The channel film 110L may include, for example, a semiconductor material. As an example, the sacrificial mold film 111L may include an insulating material. The channel film 110L may include a two-dimensional material (2D material) or a metal oxide. As another example, the channel film 110L and the sacrificial mold film 111L may each include a semiconductor material. The semiconductor material included in the channel film 110L may have an etching selectivity with respect to the semiconductor material included in the sacrificial mold film 111L. For example, in an embodiment the channel film 110L may include silicon, and the sacrificial mold film 111L may include, but is not necessarily limited to, silicon-germanium.

Figure 20:
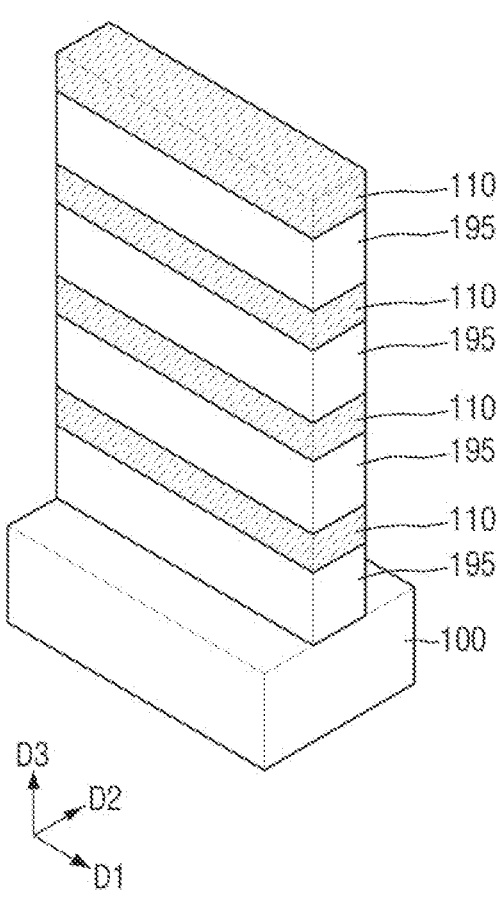

Referring to FIG. 20, the sacrificial mold film 111L and the channel film 110L may be patterned through an etching process.

A first channel pattern 110 may be formed on the substrate 100 by patterning the channel film 110L.

As an example, the sacrificial mold film 111L may include an insulating material. An inner mold insulating film 195 may be formed on the substrate 100 by patterning the sacrificial mold film 111L.

As another example, the sacrificial mold film 111L may include a semiconductor material. The sacrificial mold film 111L may be patterned. The patterned sacrificial mold film 111L may then be removed to form a mold recess between the first channel patterns 110 adjacent in the third direction D3. The mold recess may be filled with an insulating material. Accordingly, the inner mold insulating film 195 may be formed.

Figure 21:
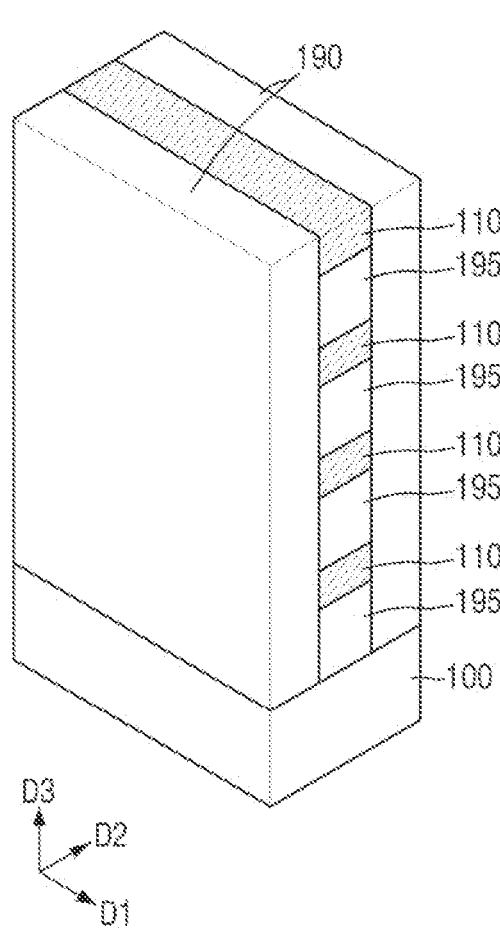

Referring to FIG. 21, an outer mold insulating film 190 may be formed on the substrate 100.

The outer mold insulating film 190 may cover the side surfaces of the inner mold insulating film 195 and the side surfaces of the first channel pattern 110.

Figure 22:
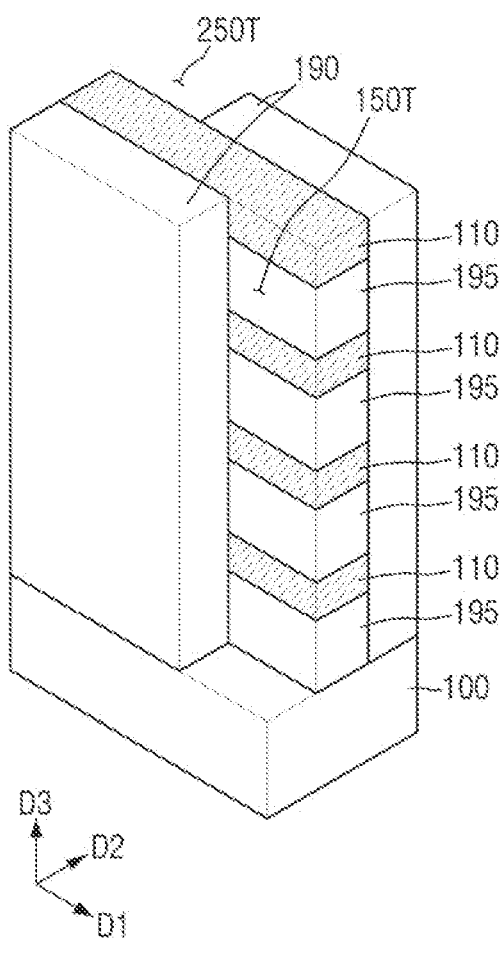

Referring to FIGS. 21 and 22, a portion of the outer mold insulating film 190 may be removed to form a first source/drain trench 150T and a second source/drain trench 250T.

The first source/drain trench 150T and the second source/drain trench 2501 may expose the side surfaces (e.g., lateral side surfaces) of the inner mold insulating film 195 and the side surfaces (e.g., lateral side surfaces) of the first channel pattern 110.

Figure 23:
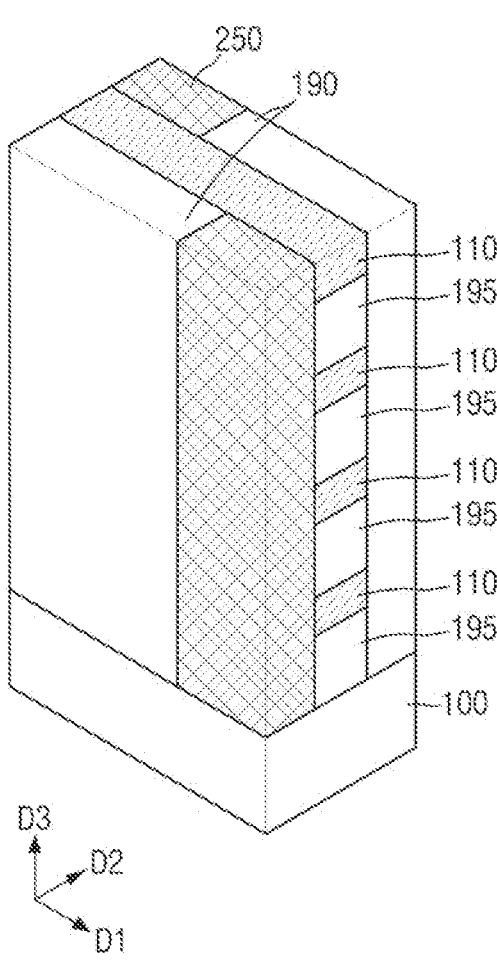

Referring to FIGS. 22 and 23, the first source/drain electrode 150 is formed inside first source/drain trench 1501. The first source/drain electrode 150 fills the first source/drain trench 150T.

The second source/drain electrode 250 is formed inside the second source/drain trench 2501. The second source/drain electrode 250 fills the second source/drain trench 250T.

Figure 24:
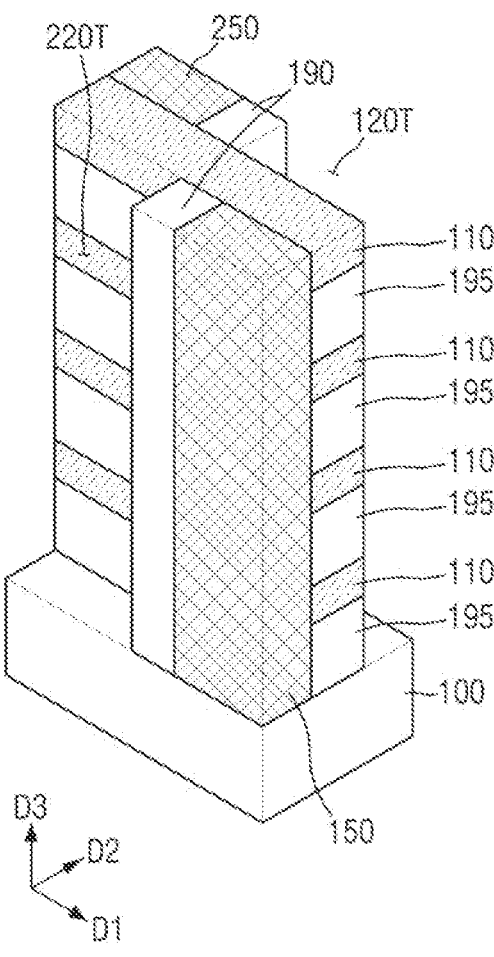

Referring to FIG. 24, a portion of the outer mold insulating film 190 may be removed to form a first gate trench 1201 and a second gate trench 220T.

The first gate trench 120T and the second gate trench 220T may expose the side surfaces of the inner mold insulating film 195 and the side surfaces of the first channel pattern 110.

Figure 25:
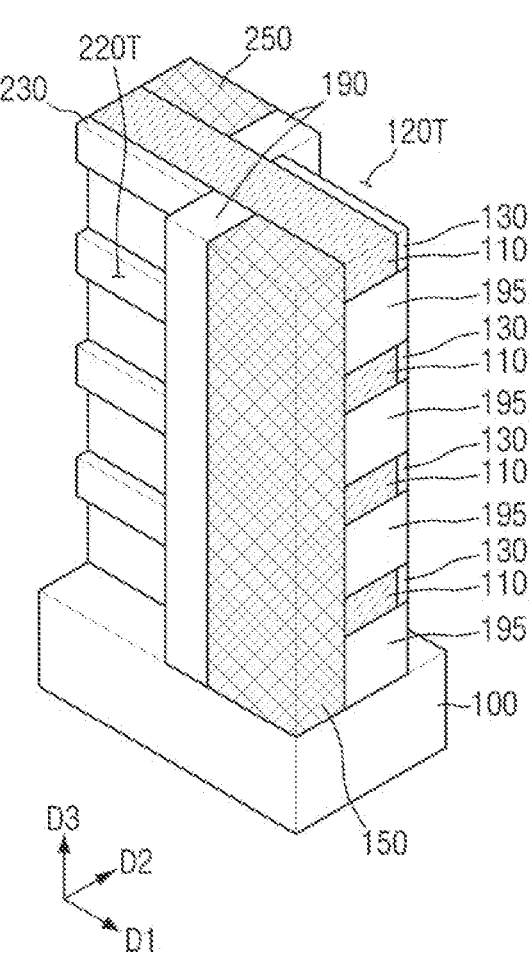

Referring to FIG. 25, the first gate insulating film 130 is formed on (e.g., formed directly thereon in the second direction D2) the first channel pattern 110 exposed by the first gate trench 120T.

The second gate insulating film 230 is formed on (e.g., formed directly thereon in the second direction D2) the first channel pattern 110 exposed by the second gate trench 220T.

Figure 26:
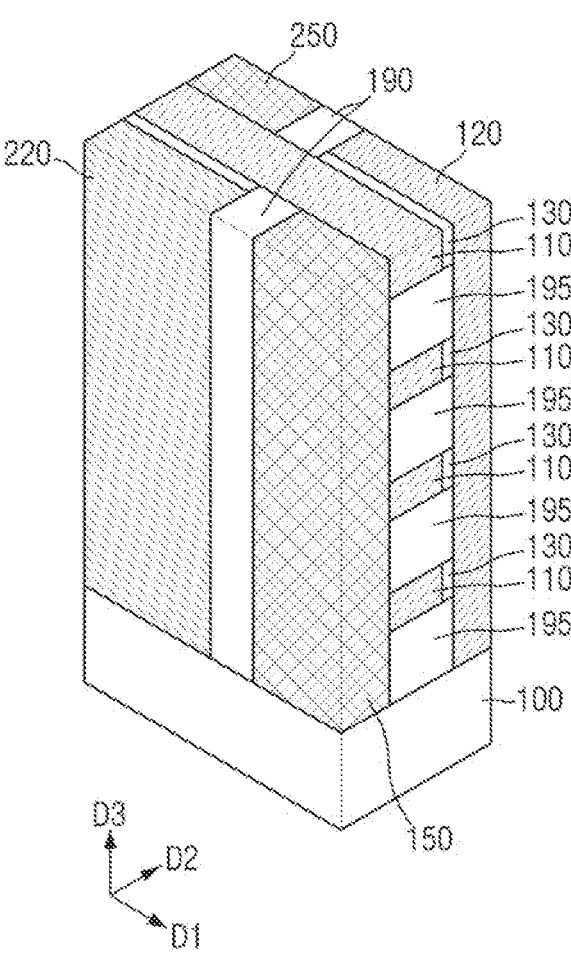

Referring to FIGS. 25 and 26, the first gate electrode 120 is formed inside the first gate trench 120T. The first gate electrode 120 fills the first gate trench 120T. The first gate electrode 120 is formed on (e.g., formed directly thereon in the second direction D2) the first gate insulating film 130.

The second gate electrode 220 is formed inside the second gate trench 220T. The second gate electrode 220 fills the second gate trench 2201. The second gate electrode 220 is formed on (e.g., formed directly thereon in the second direction D2) the second gate insulating film 230.

In concluding the detailed description, those skilled in the art will appreciate that many variations and modifications may be made to the described, non-limiting embodiments without substantially departing from the principles of the present inventive concept. Therefore, the described embodiments of the present inventive concept are used in a generic and descriptive sense only and not for purposes of limitation.

What is claimed is:

1. A semiconductor device comprising:
a substrate;
a first channel pattern disposed on the substrate, the first channel pattern including a first side and a second side opposite to each other in a first direction;
a first gate electrode disposed on the first side of the first channel pattern;
a first source/drain electrode disposed on the first side of the first channel pattern; and
a second source/drain electrode disposed on the second side of the first channel pattern,
wherein the first gate electrode overlaps the second source/drain electrode in the first direction,
wherein the first channel pattern is spaced apart from the substrate in a second direction perpendicular to the first direction.

2. The semiconductor device of claim 1, further comprising:
a second gate electrode disposed on the second side of the first channel pattern.

3. The semiconductor device of claim 2,
wherein the first gate electrode is connected to the second gate electrode.

4. The semiconductor device of claim 2,
wherein the second gate electrode overlaps the first source/drain electrode in the first direction.

5. The semiconductor device of claim 1, further comprising:
a second gate electrode disposed on the first side of the first channel pattern,
wherein the first source/drain electrode is disposed between the first gate electrode and the second gate electrode in a second direction that crosses the first direction.

6. The semiconductor device of claim 5, further comprising:
a third source/drain electrode disposed on the second side of the first channel pattern,
wherein the third source/drain electrode overlaps the second gate electrode in the first direction.

7. The semiconductor device of claim 1, further comprising:
a second channel pattern disposed on the substrate, the second channel pattern including a third side and a fourth side opposite to each other in the first direction; and
a third source/drain electrode disposed on the fourth side of the second channel pattern,
wherein the third side of the second channel pattern faces the first side of the first channel pattern, and
the first gate electrode and the first source/drain electrode are disposed between the first channel pattern and the second channel pattern in the first direction.

8. The semiconductor device of claim 7,
wherein the first gate electrode overlaps the third source/drain electrode in the first direction.

9. The semiconductor device of claim 1,
wherein the second source/drain electrode is connected to a power line.

10. A semiconductor device comprising:
a substrate;
a first source/drain electrode disposed on the substrate, the first source/drain electrode extending in a first direction;
a second source/drain electrode disposed on the substrate, the second source/drain electrode extending in the first direction;
a first channel pattern that is spaced apart from the substrate in a second direction perpendicular to the first direction, the first channel pattern is disposed between the first source/drain electrode and the second source/drain electrode;
a second channel pattern that is spaced apart from the first channel pattern in the first direction, the second channel pattern is disposed between the first source/drain electrode and the second source/drain electrode; and
a first gate electrode disposed on the first channel pattern and the second channel pattern and extending in the first direction, the first gate electrode is spaced apart from the first source/drain electrode in the second direction crossing the first direction, and overlaps the first source/drain electrode in the second direction,
wherein the second source/drain electrode is spaced apart from the first gate electrode in a third direction that crosses the first and second directions, and overlaps the first gate electrode in the third direction.

11. The semiconductor device of claim 10, further comprising:
a second gate electrode disposed on the first channel pattern and the second channel pattern and extending in the first direction,
wherein the second gate electrode is spaced apart from the second source/drain electrode in the second direction, and overlaps the second source/drain electrode in the second direction, and
the second gate electrode is spaced apart from the first source/drain electrode in the third direction, and overlaps the first source/drain electrode in the third direction.

12. The semiconductor device of claim 11,
wherein the first gate electrode is connected to the second gate electrode.

13. The semiconductor device of claim 10, further comprising:
a second gate electrode disposed on the first channel pattern, the second gate electrode is spaced apart from the second source/drain electrode in the third direction; and
a third source/drain electrode disposed on the first channel pattern, the third source/drain electrode is spaced apart from the second gate electrode in the second direction and overlaps the second gate electrode in the second direction,
wherein the second source/drain electrode is disposed between the first gate electrode and the second gate electrode.

14. The semiconductor device of claim 10, further comprising:
a third channel pattern spaced apart from the first channel pattern in the second direction; and
a third source/drain electrode disposed on the third channel pattern,
wherein the third channel pattern is disposed between the first gate electrode and the third source/drain electrode, and
the third source/drain electrode overlaps the first gate electrode and the first source/drain electrode in the second direction.

15. The semiconductor device of claim 14, wherein:
the second source/drain electrode is disposed between the first channel pattern and the third channel pattern; and
the second source/drain electrode does not overlap the first source/drain electrode and the third source/drain electrode in the second direction.

16. A semiconductor device comprising:
a substrate;
a first channel pattern that is spaced apart from the substrate in a second direction perpendicular to the first direction, the first channel pattern includes an upper side and a lower side opposite to each other in a first direction, the lower side of the first channel pattern facing the substrate;
a first gate electrode disposed on the upper side of the first channel pattern;
a first source/drain electrode disposed on the upper side of the first channel pattern, and spaced apart from the first gate electrode in the second direction perpendicular to the first direction;
a second source/drain electrode disposed on the lower side of the first channel pattern and overlapping the first gate electrode in the first direction;
a second channel pattern disposed on the first gate electrode and the first source/drain electrode, the second channel pattern including an upper side and a lower side spaced apart from each other in the first direction, the lower side of the second channel pattern facing the upper side of the first channel pattern; and
a third source/drain electrode disposed on the upper side of the second channel pattern and overlapping the first gate electrode in the first direction.

17. The semiconductor device of claim 16, further comprising:
a second gate electrode disposed on the upper side of the second channel pattern and spaced apart from the third source/drain electrode in the second direction,
wherein the second gate electrode overlaps the first source/drain electrode in the first direction, and
the second gate electrode is connected to the first gate electrode.

18. The semiconductor device of claim 16, further comprising:
a second gate electrode disposed between the upper side of the first channel pattern and the lower side of the second channel pattern, the second gate electrode is spaced apart from the first source/drain electrode in the second direction,
wherein the first source/drain electrode is disposed between the first gate electrode and the second gate electrode.

* * * * *